US009653509B2

(12) United States Patent
Nishihara et al.

(10) Patent No.: US 9,653,509 B2
(45) Date of Patent: May 16, 2017

(54) IMAGE SENSOR AND ELECTRONIC DEVICE

(71) Applicant: Sony Semiconductor Solutions Corporation, Kanagawa (JP)

(72) Inventors: Toshiyuki Nishihara, Kanagawa (JP); Hirofumi Sumi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 288 days.

(21) Appl. No.: 14/379,895

(22) PCT Filed: Jan. 28, 2013

(86) PCT No.: PCT/JP2013/051720
§ 371 (c)(1),
(2) Date: Aug. 20, 2014

(87) PCT Pub. No.: WO2013/128998
PCT Pub. Date: Sep. 6, 2013

(65) Prior Publication Data
US 2015/0021461 A1 Jan. 22, 2015

(30) Foreign Application Priority Data
Feb. 27, 2012 (JP) .................................. 2012-039561

(51) Int. Cl.
*H01L 27/146* (2006.01)
*H04N 5/378* (2011.01)
*H04N 5/3745* (2011.01)

(52) U.S. Cl.
CPC .. *H01L 27/14643* (2013.01); *H01L 27/14609* (2013.01); *H01L 27/14616* (2013.01); *H04N 5/378* (2013.01); *H04N 5/3745* (2013.01)

(58) Field of Classification Search
CPC .. H04N 5/374; H04N 5/3745; H04N 5/37452; H04N 5/37455; H04N 5/37457;
(Continued)

(56) References Cited

U.S. PATENT DOCUMENTS 7,795,650 B2* 9/2010 Eminoglu ......... H01L 27/14634
257/228
8,198,577 B2* 6/2012 Dierickx .................. G01T 1/17
250/214 DC
(Continued)

FOREIGN PATENT DOCUMENTS

CN 102169883 A 8/2011
JP 2004-055903 A 2/2004
(Continued)

OTHER PUBLICATIONS

Chinese Office Action issued Jan. 26, 2017 for corresponding Chinese Application No. 201380010138.3.

*Primary Examiner* — John Lee
(74) *Attorney, Agent, or Firm* — Michael Best & Friedrich LLP

(57) ABSTRACT

There is provided an image sensor including pixels each configured to include a transfer transistor configured as an embedded channel type MOS transistor and to output a pixel signal based on a charge transferred to a floating diffusion from a photodiode by the transfer transistor in an on state, and a determination unit configured to convert the output pixel signal to a digital value, then compare the converted digital value to a threshold value, and thereby make a binary determination on presence or absence of incidence of a photon on the pixel that has generated the pixel signal.

20 Claims, 11 Drawing Sheets

(58) Field of Classification Search
CPC . H04N 5/378; H01L 27/146; H01L 27/14609;
H01L 27/1461; H01L 27/14612; H01L
27/14616; H01L 27/14643; H01L
27/14654; H01L 27/14656
See application file for complete search history.

(56) References Cited

U.S. PATENT DOCUMENTS

| | | | | |
|---|---|---|---|---|
| 8,440,957 B2* | 5/2013 | Dierickx | | G01T 1/17 250/214 R |
| 8,809,921 B2* | 8/2014 | Yamada | | H01L 27/1461 257/219 |
| 9,100,603 B2* | 8/2015 | Nishihara | | H01L 27/14603 |
| 9,202,830 B2* | 12/2015 | Nishihara | | H01L 27/14609 |
| 9,294,700 B2* | 3/2016 | Nishihara | | H01L 27/14603 |
| 2004/0017224 A1* | 1/2004 | Tumer | | H03F 3/087 327/51 |
| 2006/0084195 A1* | 4/2006 | Lyu | | H01L 27/14603 438/48 |
| 2008/0106622 A1* | 5/2008 | Turchetta | | H04N 3/155 348/294 |
| 2008/0239124 A1* | 10/2008 | Mori | | H04N 3/155 348/308 |
| 2009/0039273 A1* | 2/2009 | Tkaczyk | | G01T 1/171 250/370.06 |
| 2009/0215221 A1* | 8/2009 | Yoo | | H01L 27/14609 438/97 |
| 2010/0090092 A1* | 4/2010 | Yamashita | | H04N 5/3765 250/208.1 |
| 2010/0213353 A1* | 8/2010 | Dierickx | | G01T 1/247 250/214 R |
| 2010/0276574 A1* | 11/2010 | Manabe | | H04N 5/353 250/214 A |
| 2011/0134264 A1* | 6/2011 | Nishihara | | H01L 27/14609 348/222.1 |
| 2011/0180860 A1* | 7/2011 | Yamada | | H01L 27/1461 257/291 |
| 2011/0210235 A1* | 9/2011 | Dierickx | | G01T 1/17 250/214 R |
| 2011/0215222 A1* | 9/2011 | Eminoglu | | H01L 27/14634 250/208.1 |
| 2011/0249148 A1* | 10/2011 | Prescher | | G01S 17/023 348/234 |
| 2012/0056079 A1* | 3/2012 | Levine | | H04N 5/3592 250/214 P |
| 2013/0092982 A1* | 4/2013 | Chen | | H01L 27/14689 257/223 |
| 2014/0293107 A1* | 10/2014 | Nishihara | | H01L 27/14603 348/308 |
| 2014/0332668 A1* | 11/2014 | Nishihara | | H04N 5/32 250/208.1 |
| 2014/0375855 A1* | 12/2014 | Nishihara | | H01L 27/14603 348/301 |
| 2015/0021461 A1* | 1/2015 | Nishihara | | H01L 27/14616 250/208.1 |
| 2015/0115163 A1* | 4/2015 | Nishihara | | H04N 5/32 250/366 |
| 2015/0226865 A1* | 8/2015 | Nishihara | | H01L 27/14609 250/366 |
| 2016/0191830 A1* | 6/2016 | Nishihara | | H01L 27/14603 348/294 |
| 2016/0216381 A1* | 7/2016 | Nishihara | | G01T 1/1644 |
| 2016/0219234 A1* | 7/2016 | Nishihara | | H04N 5/378 |
| 2016/0234450 A1* | 8/2016 | Nishihara | | H01L 27/14603 |
| 2016/0241795 A1* | 8/2016 | Nishihara | | H04N 5/32 |

FOREIGN PATENT DOCUMENTS

| | | |
|---|---|---|
| JP | 2005-175316 A | 6/2005 |
| JP | 2011-097581 A | 5/2011 |
| JP | 2011-119441 A | 6/2011 |

\* cited by examiner

FIG. 6
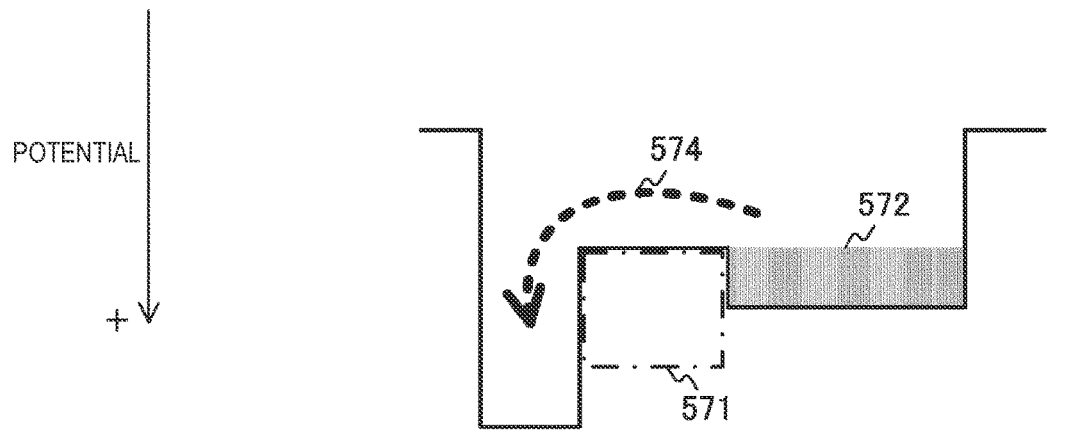
a
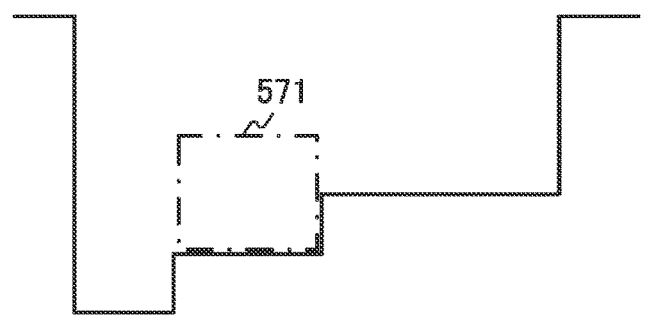
b

FIG. 7
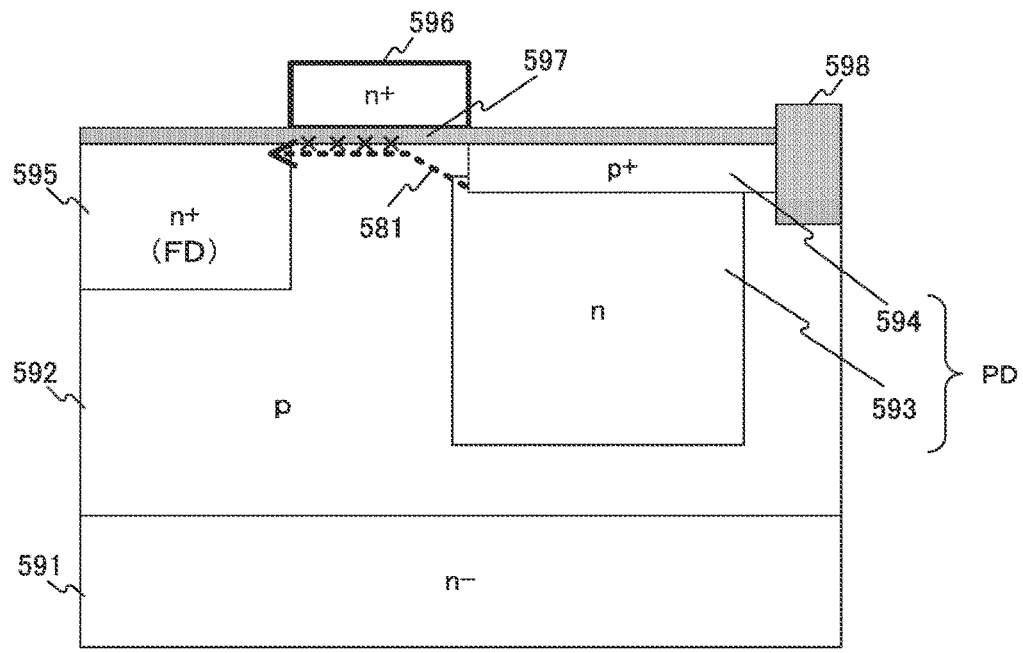
a
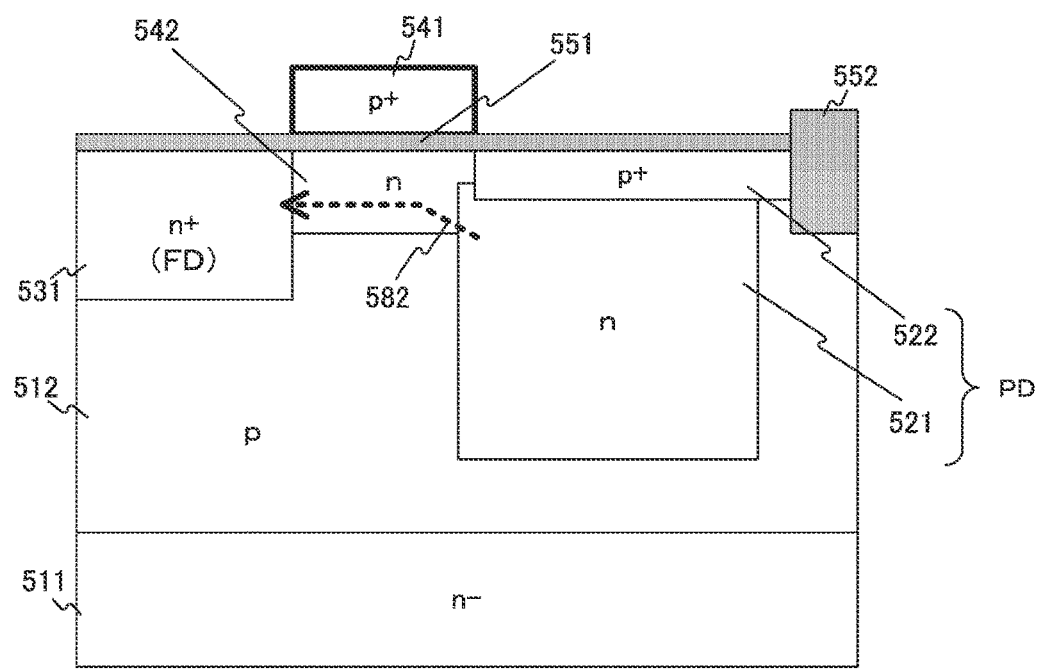
b

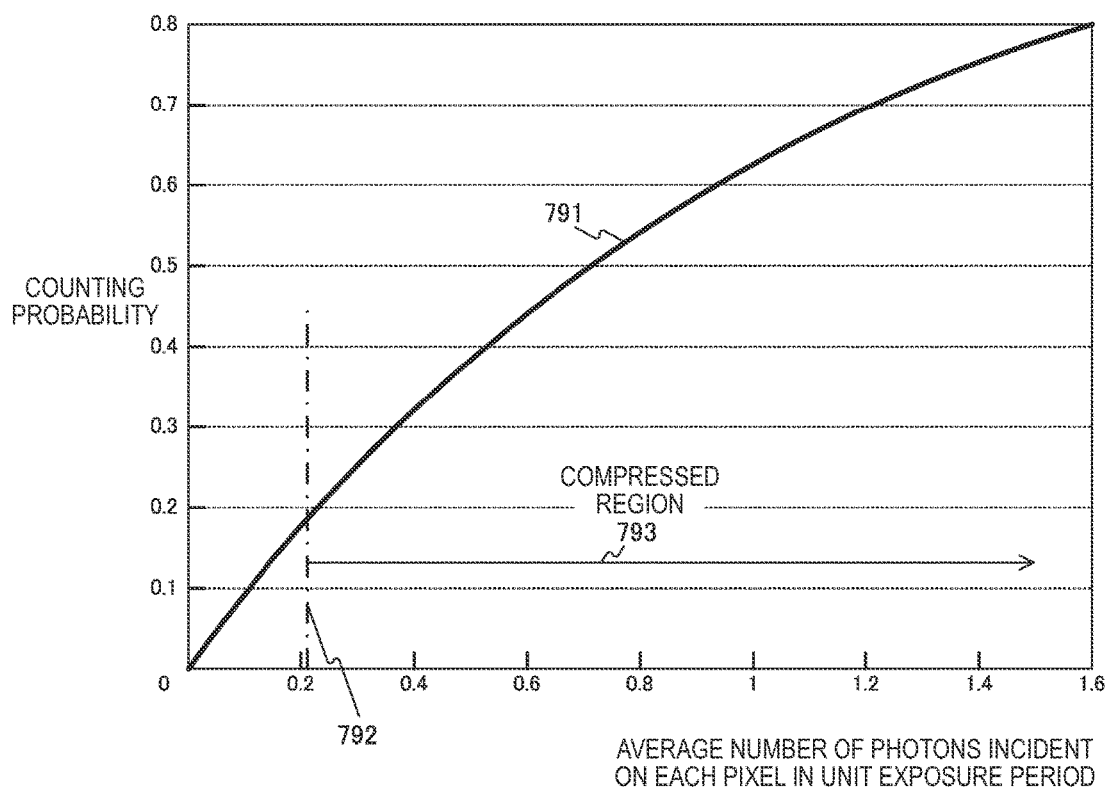

IMAGE SENSOR AND ELECTRONIC DEVICE

TECHNICAL FIELD

The present technology relates to an image sensor. Particularly, the technology relates to an image sensor and an electronic device that detect weak light.

BACKGROUND ART

In recent years, devices that detect weak light have been widely introduced mainly in the medical and research fields. Such devices mostly use a relatively expensive photomultiplier tube as a detection unit of weak light.

In addition, a device that detects weak light using an image sensor such as a CMOS (Complementary Metal Oxide Semiconductor) image sensor that can be manufactured at a low cost instead of a photomultiplier tube has also been proposed (for example, refer to Patent Literature 1).

CITATION LIST

Patent Literature

Patent Literature 1: JP 2011-97581A

SUMMARY OF INVENTION

Technical Problem

In the above-described related art, weak light can be detected by counting the number of photons (photon-counting) incident on each pixel of the CMOS image sensor.

Note that, since a pixel signal is extremely weak when weak light is detected, it is desirable to reflect electrons generated from photoelectric conversion on intensity of the pixel signal while losing as few electrons as possible. In general, however, when electrons generated in a photodiode are transferred to a floating diffusion, carriers (electrons) are doped at an interface level generated due to a defect present on a gate oxide film interface (interface defect) of a transfer transistor. Accordingly, some of the generated electrons are lost. Since, however, the number of doped electrons is several tens at the maximum in general applications in which many electrons are accumulated (for example, photographing a landscape or the like), the number of doped electrons hardly affects a pixel signal. Since, however, only a slight number of electrons are generated when weak light is detected the number of doped electrons is considered to greatly affect a pixel signal. For this reason, it is important to improve detection accuracy (accuracy in photon-counting) by reducing the number of doped electrons.

The present technology has been created taking the above circumstances into consideration, and aims to improve accuracy in photon-counting.

Solution to Problem

The present disclosure has been made in order to eliminate the above described problem. According to a first aspect of the present disclosure, there is provided an image sensor including pixels each configured to include a transfer transistor configured as an embedded channel type MOS transistor and to output a pixel signal based on a charge transferred to a floating diffusion from a photodiode by the transfer transistor in an on state, and a determination unit configured to convert the output pixel signal to a digital value, then compare the converted digital value to a threshold value, and thereby make a binary determination on presence or absence of incidence of a photon on the pixel that has generated the pixel signal. Accordingly, the image sensor that makes a binary determination on presence or absence of incidence of a photon on a pixel exhibits the effect of reducing influence of an interface state on the transfer transistor.

According to the first aspect of the present disclosure, the photodiode may include a charge accumulation region constituted by a first conductive impurity diffusion layer. The floating diffusion may be constituted by the first conductive impurity diffusion layer. The transfer transistor may include a channel region serving as a channel between the photodiode and the floating diffusion, and the channel region may be constituted by the first conductive impurity diffusion layer having a concentration equal to or higher than $1\times10^{15}$ atoms/cm$^3$. Accordingly, the effect that the channel region is formed of the first conductive impurity diffusion region having a concentration equal to or higher than $1\times10^{15}$ atoms/cm$^3$ can be exhibited.

According to the first aspect of the present disclosure, the channel region may have the peak of impurities formed in a depth within 0.2 μm from a substrate surface on a side on which a gate electrode of the transfer transistor is formed. Accordingly, the effect that the channel region having the peak of the impurities in the depth within 0.2 μm from the substrate surface is formed can be exhibited.

According to the first aspect of the present disclosure, when the transfer transistor is in an off state, the channel region may function as an overflow drain for discharging surplus charges from the charge accumulation region to the impurity diffusion layer. Accordingly, the effect that the channel region functions as the overflow drain in the turned-off state of the transfer transistor can be exhibited.

According to the first aspect of the present disclosure, as the transfer transistor modulates a potential on a substrate surface that a gate electrode of the transfer transistor faces in a direction in which the potential becomes shallow using a difference of work functions of the gate electrode and the substrate that the gate electrode faces, the channel may be formed in a position away from the substrate surface that the gate electrode faces toward the inside of the substrate. Accordingly, the effect that the potential becomes shallow on the substrate surface that the gate electrode faces and the channel is formed in the position apart from the substrate surface that the gate electrode faces toward the inside of the substrate can be exhibited.

According to the first aspect of the present disclosure, the transfer transistor may have the peak of impurities formed in a depth within 0.2 μm from a substrate surface on the side on which a gate electrode of the transfer transistor is formed, and a second conductive impurity diffusion layer may be formed between the peak of the impurities and the gate electrode. Accordingly, the effect that the peak of the impurities is formed in the depth within 0.2 μm from the substrate surface on the side on which the gate electrode of the transfer transistor is formed and the second conductive impurity diffusion layer is formed between the peak of the impurities and the gate electrode can be exhibited.

According to a second aspect of the present disclosure, there is provided an image sensor including pixels each configured to include a transfer transistor configured as an embedded channel type MOS transistor and to output a pixel signal based on a charge transferred to a floating diffusion from a photodiode by the transfer transistor in an on state, and a determination unit configured to convert the output pixel signal to a digital value, then compare the converted digital value to a plurality of threshold values, and thereby make a determination on the number of photons incident on the pixel that has generated the pixel signal. Accordingly, the effect of reducing influence of an interface state on the transfer transistor in the image sensor that receives weak light and counts the number of photons incident on the pixel can be exhibited.

According to a third aspect of the present disclosure, there is provided an electronic device including pixels each configured to include a transfer transistor configured as an embedded channel type MOS transistor and to output a pixel signal based on a charge transferred to a floating diffusion from a photodiode by the transfer transistor in an on state, and a determination unit configured to convert the output pixel signal to a digital value, then compare the converted digital value to a threshold value, and thereby make a binary determination on presence or absence of incidence of a photon on the pixel that has generated the pixel signal. Accordingly, the effect of reducing influence of an interface state on the transfer transistor in the electronic device that makes a binary determination on presence or absence of incidence of a photon on the pixel can be exhibited.

Advantageous Effects of Invention

According to the present technology, the excellent effect of improving accuracy in photon-counting can be exhibited.

BRIEF DESCRIPTION OF DRAWINGS

FIG. 6 is a diagram schematically showing a potential profile in the lateral direction (a position on the line C-D of FIG. 4) of an n-type diffusion layer 542 in the first embodiment of the present technology.

FIG. 7 is a diagram schematically showing a transfer route of electrons in the pixel 310 provided in the image sensor 100 of the first embodiment of the present technology and a transfer route of electrons in a pixel provided in another image sensor.

FIG. 11 is a graph showing the relationship between the average number of photons incident on each pixel in a unit exposure period and a counting probability in the third embodiment of the present technology.

DESCRIPTION OF EMBODIMENTS

Hereinafter, embodiments for implementing the present technology (hereinafter referred to as embodiments) will be described. Description will be provided in the following order.

1. First embodiment (Imaging control: Example in which an embedded channel type transfer transistor is configured using the work function of a transfer gate electrode)

2. Second embodiment (Imaging control: Example in which an embedded channel type transfer transistor is configured through adjustment of an impurity profile)

3. Third embodiment (Imaging control: Example of single-photon detection)

1. First Embodiment

Configuration Example of an Image Sensor

Figure 1:
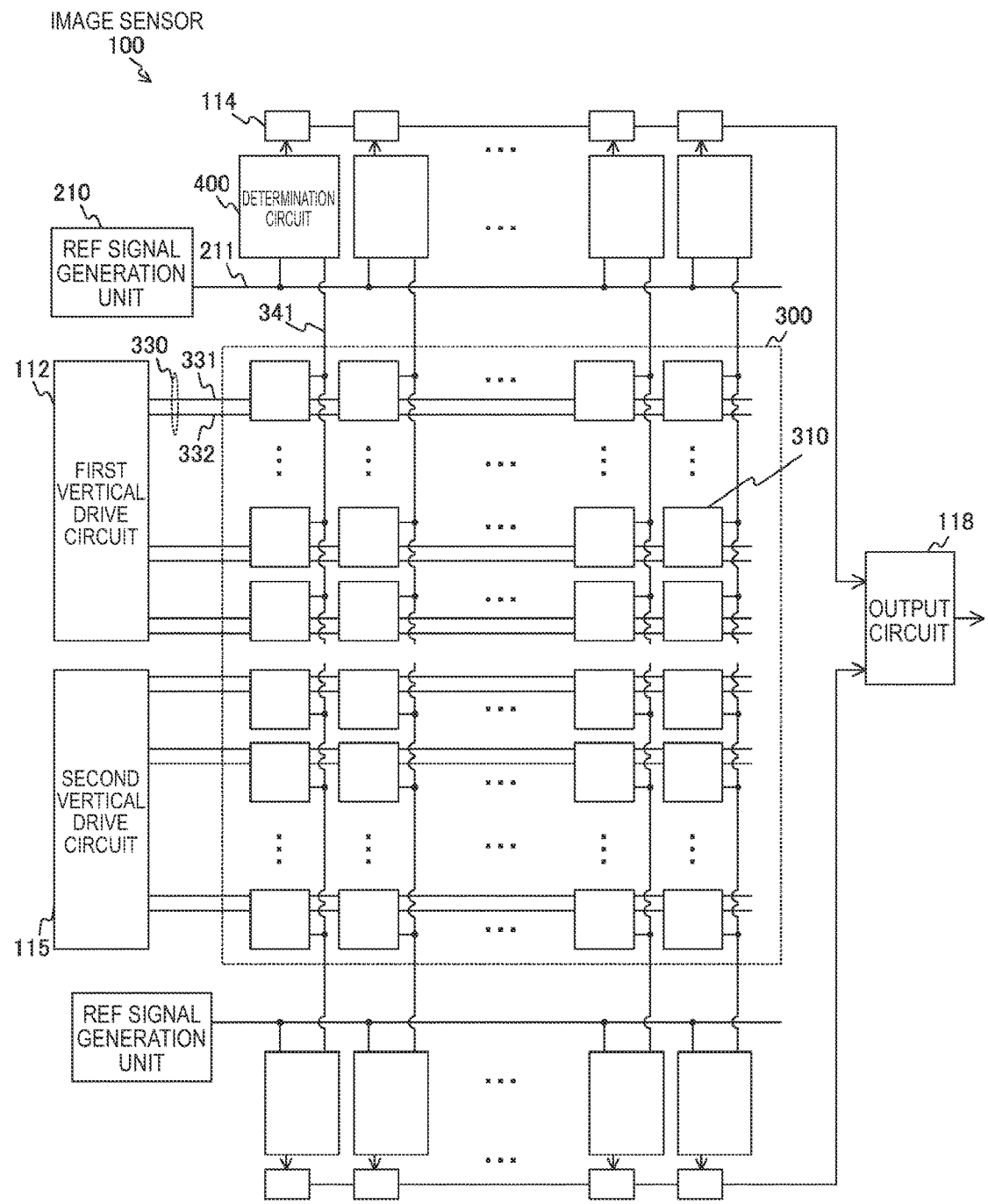
FIG. 1 is a conceptual diagram showing an example of a basic configuration example of an image sensor 100 of a first embodiment of the present technology.

FIG. 1 is a conceptual diagram showing an example of a basic configuration example of an image sensor 100 of a first embodiment of the present technology.

The image sensor 100 is a light detector provided in a system for detecting weak light (for example, a fluorescent scanner of an imaging plate, a scintillation counter of radiation, or the like). The image sensor 100 is realized by, for example a CMOS (Complementary Metal Oxide Semiconductor) sensor.

Note that, in FIG. 1, description will be provided on the assumption that the image sensor is driven (controlled) by two vertical control circuits in order to speed up reading.

The image sensor 100 is provided with a pixel array unit 300, a first vertical drive circuit 112, determination circuits 400, registers 114, a second vertical drive circuit 115, and an output circuit 118. It should be noted that, since a determination circuit and a register for processing signals of pixels driven by the second vertical drive circuit 115 are the same as a determination circuit (determination circuit 400) and a register (register 114) for processing signals of pixels driven by the first vertical drive circuit 112, description thereof will be omitted.

The pixel array unit 300 is provided with a plurality of pixels (pixels 310) arrayed in a two-dimensional matrix shape (n×m). It should be noted that the first embodiment of the present technology is assumed to have the pixels 310 arrayed in 128 rows×128 columns in the pixel array unit 300. In the pixel array unit 300 of FIG. 1, some of the pixels 310 of 128 rows×128 columns are shown. Half of the pixels among the pixels 310 arrayed in the pixel array unit 300 (pixels positioned in the upper half of the pixel array unit 300 of FIG. 1) are wired with control lines (control lines 330) from the first vertical drive circuit 112 in units of rows. On the other hand, the other half of the pixels (pixels positioned in the lower half of the pixel array unit 300 of FIG. 1) are wired with control lines from the second vertical drive circuit 115 in units of rows. Since the circuit configuration of the pixels 310 will be described with reference to FIG. 2, description thereof is omitted herein.

In addition, the pixels 310 are wired with vertical signal lines (vertical signal lines 341) in units of columns. The vertical signal lines 341 connected to the pixels wired with the control lines 330 from the first vertical drive circuit 112 are connected to the determination circuits 400 facing an upper side of the pixel array unit 300. In addition, the vertical signal lines 341 connected to the pixels wired with the control lines 330 from the second vertical drive circuit 115 are connected to the determination circuits 400 facing a lower side of the pixel array unit 300.

The first vertical drive circuit 112 supplies signals to the pixels 310 via the control lines 330, and selectively scans the pixels 310 sequentially in the longitudinal direction (column direction) in units of rows. By performing the selective scanning by the first vertical drive circuit 112 in units of rows, signals are output from the pixels 310 in units of rows. Note that the control lines 330 include pixel reset lines 331 and charge transfer lines 332. Since the pixel reset lines 331 and the charge transfer lines 332 will be described with reference to FIG. 2, description thereof is omitted herein.

In addition, since the second vertical drive circuit 115 is the same as the first vertical drive circuit 112 except for the fact that pixels 310 to be controlled thereby are different, description thereof is omitted herein. As the first vertical drive circuit 112 and the second vertical drive circuit 115 drive the pixels 310, two rows are selectively scanned at substantially the same time, and reading from two rows is performed at substantially the same time.

The determination circuits 400 compute an amount of light incident on the pixels 310 based on output signals supplied from the pixels 310. The determination circuits 400 are provided for each of the vertical signal lines 341. In other words, 128 determination circuits 400 which are connected to 128 respective vertical signal lines 341 wired for the pixels (64 rows×128 columns) driven by the first vertical drive circuit 112 are provided in the positions facing the upper side of the pixel array unit 300. In addition, in the positions facing the lower side of the pixel array unit 300, 128 determination circuits 400 which are respectively connected to 128 vertical signal lines 341 wired for the pixels (64 rows×128 columns) driven by the second vertical drive circuit 115 are provided.

The registers 114 are provided for each of the determination circuits 400 to temporarily retain determination results supplied from the determination circuits 400. The registers 114 sequentially output the retained determination results to the output circuit 118 for the period in which a signal of a next pixel row is read (reading period).

The output circuit 118 outputs signals generated by the image sensor 100 to an external circuit.

Next, an example of a circuit configuration of the pixels 310 will be described with reference to FIG. 2.

[Circuit Configuration Example of a Pixel]

Figure 2:
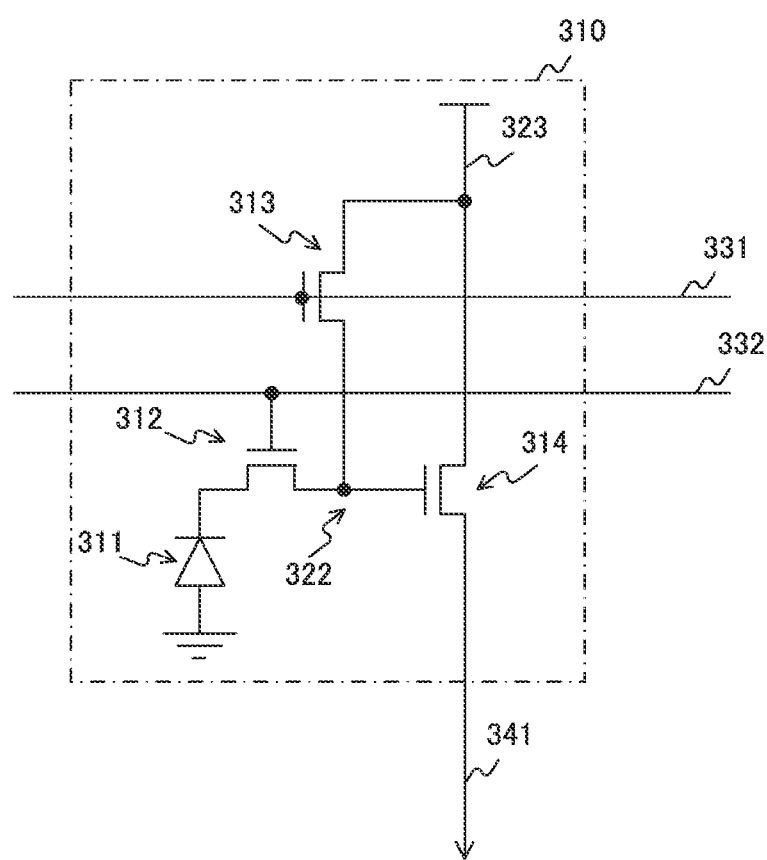
FIG. 2 is a schematic diagram showing an example of a circuit configuration of a pixel 310 of the first embodiment of the present technology.

FIG. 2 is a schematic diagram showing an example of a circuit configuration of the pixel 310 of the first embodiment of the present technology.

The pixel 310 converts an optical signal that is incident light into an electric signal by performing photoelectric conversion. The pixel 310 amplifies the converted electric signal and then outputs the signal as a pixel signal. The pixel 310 amplifies the electric signal using, for example, an FD amplifier that has a floating diffusion layer (FD: Floating-Diffusion).

The pixel 310 is provided with a photodiode 311, a transfer transistor 312, a reset transistor 313, and an amplifying transistor 314.

In the pixel 310, the anode terminal of the photodiode 311 is grounded, and the cathode terminal thereof is connected to the source terminal of the transfer transistor 312. In addition, the gate terminal of the transfer transistor 312 is connected to the charge transfer line 332, and the drain terminal thereof is connected to the source terminal of the reset transistor 313 and the gate terminal of the amplifying transistor 314 via the floating diffusion (FD 322).

In addition, the gate terminal of the reset transistor 313 is connected to the pixel reset line 331, and the drain terminal thereof is connected to a power supply line 323 and the drain terminal of the amplifying transistor 314. In addition, the source terminal of the amplifying transistor 314 is connected to the vertical signal line 341.

The photodiode 311 is a photoelectric conversion element that generates charges according to intensity of light. In the photodiode 311, pairs of electrons and holes are generated by photons incident on the photodiode 311, and the generated electrons are accumulated there.

The transfer transistor 312 transfers the electrons generated in the photodiode 311 to the FD 322 according to a signal (transfer pulse) from the vertical drive circuit (the first vertical drive circuit 112 or the second vertical drive circuit 115). The transfer transistor 312 is in a conductive state when, for example, a signal (pulse) which is a subject to be supplied to the gate terminal is supplied from the charge transfer line 332, and thereby transfers the electrons generated in the photodiode 311 to the FD 322. Note that, for the purpose of preventing carriers from being doped due to an interface defect, the transfer transistor 312 is realized as an embedded channel-type MOS transistor. Note that, since details of the transfer transistor 312 will be described with reference to FIG. 4, detail of description thereof is omitted herein.

The reset transistor 313 resets a potential of the FD 322 according to a signal (reset pulse) supplied from the vertical drive circuit (the first vertical drive circuit 112 or the second vertical drive circuit 115). The reset transistor 313 is in a conductive state when a reset pulse is supplied to the gate terminal thereof via the pixel reset line 331, and a current thereby flows from the FD 322 to the power supply line 323. Accordingly, electrons accumulated in the floating diffusion (FD 322) are taken out for power supply, and accordingly the FD 322 is reset (hereinbelow, the potential of this time is referred to as a reset potential). Note that, when the photodiode 311 is to be reset, the transfer transistor 312 and the reset transistor 313 are in conductive states at the same time. Accordingly, electrons accumulated in the photodiode 311 are taken out for power supply, and then the photodiode is reset in a state with no incident photons (dark state). Note that a potential (power) flowing on the power supply line 323 is power used for resetting and a source follower, and for example, 3 V is supplied.

The amplifying transistor 314 amplifies a potential of the floating diffusion (FD 322) and then outputs a signal (output signal) according to the amplified potential to the vertical signal line 341. In the state in which the potential of the floating diffusion (FD 322) has been reset (in the case of a reset potential), the amplifying transistor 314 outputs an output signal according to the reset potential (hereinbelow referred to as a reset signal) to the vertical signal line 341. In addition, when the electrons accumulated in the photodiode 311 are transferred to the FD 322, the amplifying transistor 314 outputs an output signal (hereinbelow referred to as an accumulation signal) according to the amount of the transferred electrons to the vertical signal line 341. Note that, when a plurality of pixels share the vertical signal line

341 as shown in FIG. 1, each selection transistor may be provided for each pixel between the amplifying transistor 314 and the vertical signal line 341.

Note that the basic circuit and an operation mechanism of the pixel shown in FIG. 2 are the same as those of a normal pixel, and in addition, a variety of variations can be considered. The pixels introduced in the present technology are designed to have remarkably higher conversion efficiency than pixels of the related art. To this end, the pixels are designed to actually have extremely low parasitic capacitance of the gate terminal of the amplifier (the amplifying transistor 314) constituting a source follower (parasitic capacitance of the FD 322).

Next, an example of the layout of the pixel 310 that is designed to have low parasitic capacitance of the gate terminal of the amplifying transistor 314 will be described with reference to FIG. 3.

[Planar Layout Example of a Pixel]

Figure 3:
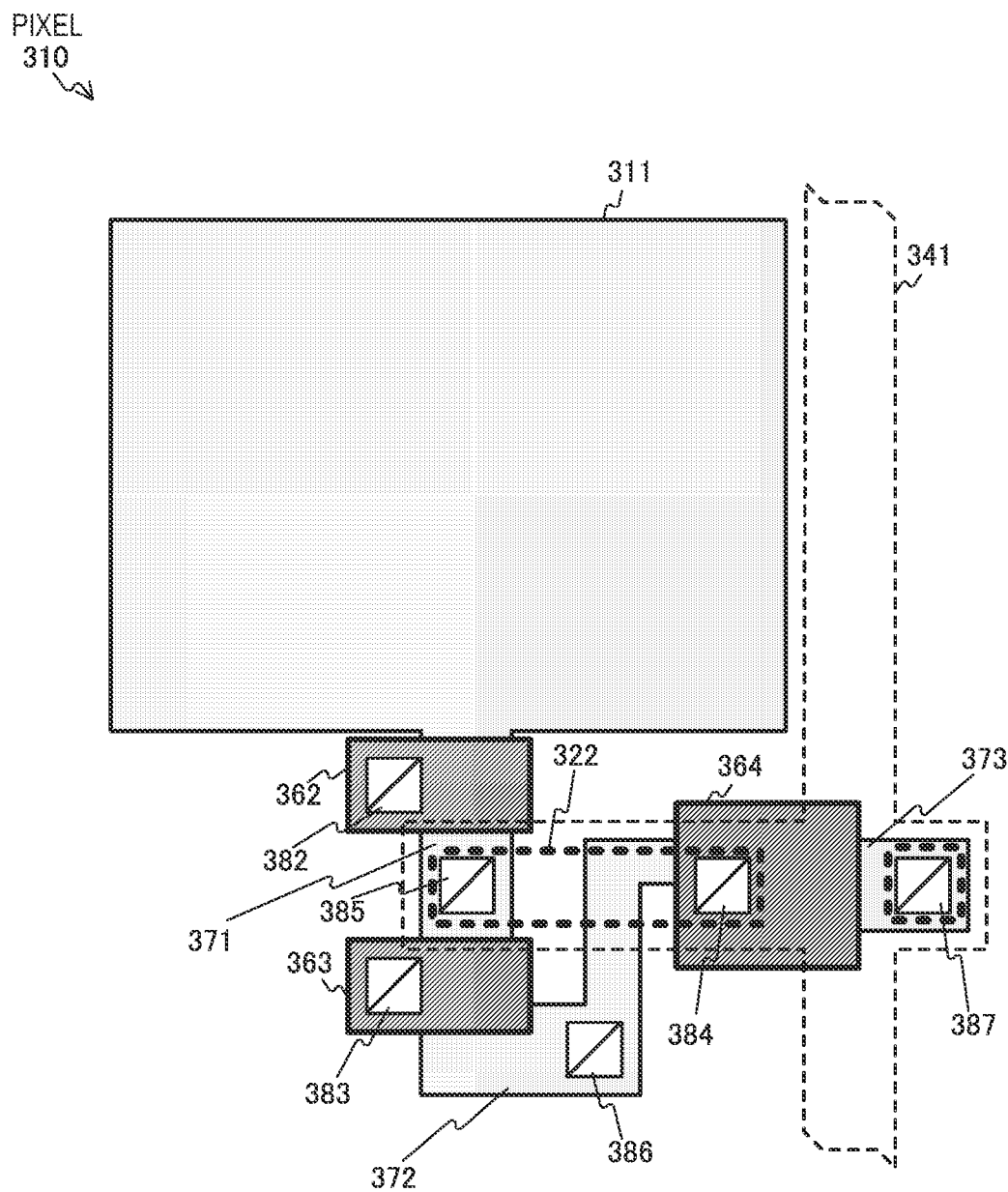
FIG. 3 is a diagram schematically showing an example of the layout of the pixel 310 of the first embodiment of the present technology.

FIG. 3 is a diagram schematically showing an example of the layout of the pixel 310 of the first embodiment of the present technology.

Herein, description will be provided focusing on the parasitic capacitance of the gate terminal of the amplifying transistor 314 and the floating diffusion (FD 322).

In the layout of the pixel 310 shown in FIG. 3, the photodiode 311, the FD 322, and the vertical signal line 341 are shown. In addition, wiring of the gate terminal (gate wiring 362) of the transfer transistor 312, wiring of the gate terminal (gate wiring 363) of the reset transistor 313, and wiring of the gate terminal (gate wiring 364) of the amplifying transistor 314 are shown in FIG. 3. Note that the FD 322 is indicated by a thick dashed line, the vertical signal line 341 is indicated by a thin dashed line, and the gate wiring 362 to 364 are indicated by rectangles filled with oblique lines.

Furthermore, FIG. 3 shows the drain terminal of the transfer transistor 312, the source terminal of the reset transistor 313, an impurity diffusion layer (diffusion layer 371) that corresponds to wiring between the two terminals. In addition, FIG. 3 shows the drain terminal of the reset transistor 313, the drain terminal of the amplifying transistor 314, and another impurity diffusion layer (diffusion layer 372) that corresponds to wiring between the two terminals. Furthermore, FIG. 3 shows another impurity diffusion layer (diffusion layer 373) that corresponds to the source terminal of the amplifying transistor 314. Note that the diffusion layers 371 to 373 are indicated with rectangles filled with fine dots.

Furthermore, in the layout, a contact (contact 382) for connecting the gate wiring 362 to the charge transfer line 332 and a contact (contact 383) for connecting the gate wiring 363 to the pixel reset line 331 are shown. In addition, in the layout, a contact (contact 384) for connecting the gate wiring 364 to the FD 322 and a contact (contact 385) for connecting the diffusion layer 371 to the FD 322 are shown. Furthermore, in the layout, a contact (contact 386) for connecting the diffusion layer 372 to the power supply line 323 and a contact (contact 387) for connecting the diffusion layer 373 to the vertical signal line 341 are shown.

Note that the diffusion layer 371 and the gate wiring 364 are a part of the floating diffusion that have the same potential change as the FD 322, but for the sake of convenience of description, they will be described with different reference numbers in FIG. 3.

Herein, the layout of the pixel 310 will be described focusing on the size of the FD 322. The layout of the pixel 310 is designed so that the FD 322 has the minimum parasitic capacitance. For this reason, the layout of the pixel 310 is designed to have a minimum area in which the FD 322 that is the wiring part connecting the diffusion layer 371 and the gate wiring 364, the diffusion layer 371, and the gate wiring 364 can be manufactured. Furthermore, in the pixel 310, at the same time as the width of the drain terminal of the amplifying transistor 314 (in the periphery of the gate wiring 364 of the diffusion layer 373) tapers, the wiring connected to the source terminal of the amplifying transistor 314 (vertical signal line 341) covers the plane of the greater part of the FD 322.

Since an output of the source follower has gain close to 1 with respect to an input, the substantial parasitic capacitance between the vertical signal line 341 and the FD 322 is very low. For this reason, by having a shield structure of the FD 322 covered by the vertical signal line 341 as shown in FIG. 3, the parasitic capacitance of the FD 322 can be minimized and thus conversion efficiency can be dramatically enhanced.

By reducing the parasitic capacitance using the design as shown in FIG. 3, a sufficiently large output signal can be output to the vertical signal line 341 even when the number of electrons accumulated in the FD 322 is small. The size of the output signal may be sufficiently larger than random noise of the amplifying transistor 314. When the output signal when one photon is accumulated in the FD 322 is sufficiently larger than random noise of the amplifying transistor 314, a signal from the pixel is quantized and the number of photons accumulated in the pixel can be detected as a digital signal.

For example, when the random noise of the amplifying transistor 314 is about 50 µV to 100 µV and conversion efficiency of the output signal is raised to about 600 µV/e$^-$, the output signal is sufficiently larger than the random noise, and thus one photon can be detected in principle.

As described above, when conversion efficiency is sufficiently high, an output signal of a pixel provided with a photodiode and an amplifying transistor can also be treated as analog data having grayscales even if it is binary data. There is, however, a problem that such a pixel has a low upper limit (dynamic range) of an amount of detected light in one imaging. In order to increase the dynamic range, it is effective to raise a speed of reading a signal output by a pixel to raise a frame rate, and then to gather reading results of a plurality of times. When, for example, results are gathered after performing exposure and reading 1023 times to make a binary determination on incidence of a photon, the dynamic range for one pixel is 10-bit grayscale data. In addition, when results are gathered after performing exposure and reading 512 times to make a determination on incidence of 0 to 2 photons as digital outputs having three values of 0, 1, and 2, the dynamic range for one pixel is 10-bit grayscale data. In addition, even when the maximum number of accumulated electrons is 1000 e$^-$, and the number of photons is determined after they are analog-output, if results are gathered after performing exposure and reading 16 times, the results are equivalent to the output of pixels having the maximum number of accumulated electrons of 16,000 e$^-$.

Furthermore, the dynamic range can be widened by disposing a plurality of fine pixels in an array shape and setting the plurality of pixels on one light receiving plane. For example, when pixels of 8 rows×8 columns (or a pixel group) are set on one light receiving plane, by making a binary determination on and summing photons incident on the pixels of 8 rows×8 columns, a determination result of intensity of light with 64 grayscales equivalent to 6 bits can be acquired. Furthermore, if such plane division is used together with time division, the dynamic range can be further widened.

As described above, by reducing the parasitic capacitance, the sufficiently large output signal can be output to the vertical signal line 341 even when the number of electrons accumulated in the FD 322 is small. When the electrons generated in the photodiode are trapped before being accumulated in the FD 322, however, an output signal is not output since the electrons are not accumulated in the FD 322. In other words, reducing the number of trapped electrons generated in the photodiode before being accumulated in the FD 322 is important in detection of one photon.

Next, an example of a cross-sectional configuration of the transfer transistor 312 for reducing the number of carriers trapped due to an interface defect will be described with reference to FIG. 4.

[Cross-Sectional Configuration Example of a Pixel]

Figure 4:
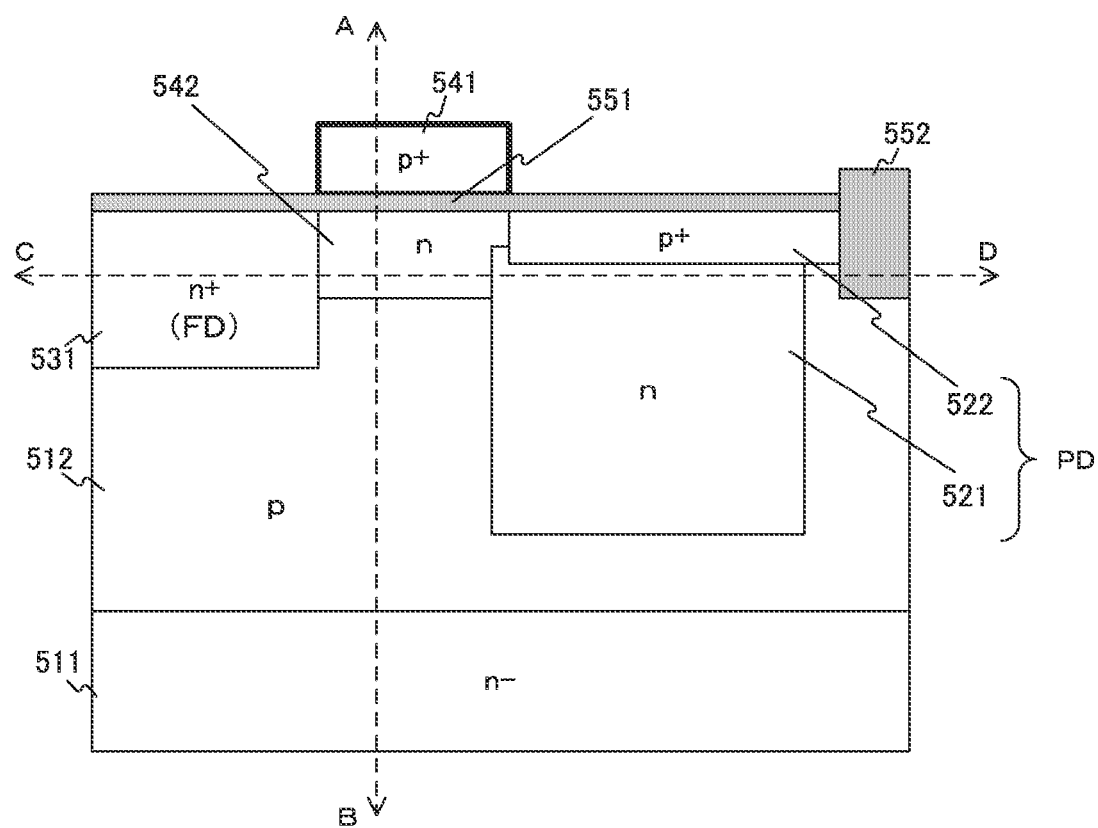
FIG. 4 is a diagram schematically showing a cross-sectional configuration of a transfer transistor 312 of the pixel 310 of the first embodiment of the present technology.

FIG. 4 is a diagram schematically showing a cross-sectional configuration of the transfer transistor 312 of the pixel 310 of the first embodiment of the present technology.

Note that, in FIG. 4, the cross-section of the positions of the photodiode 311, the gate wiring 362, and the diffusion layer 371 on the plane diagram shown in FIG. 3 is shown focusing on the transfer transistor 312.

Note that, herein, description will be provided on the assumption that a part of the configuration of the pixel 310 is incorporated in a p-well (p-well 512) formed on an n-type epitaxial substrate with a high resistance (substrate 511) in an appropriate impurity profile using several stages of ion implantation. Note that "+" and "−" shown in FIG. 4 indicate a concentration of impurities. In a p-type layer, for example, the relationship of concentrations of impurities is p−<p<p+.

In the cross-sectional configuration shown in FIG. 4, the substrate 511, the p-well 512, an accumulation region 521, a p-type diffusion layer 522, a floating diffusion region 531, a transfer gate electrode 541, and an n-type diffusion layer 542 are shown. In addition, in the cross-sectional configuration, an insulating film 551 formed of an oxidized film and an element separation region 552 are shown by regions filled with dots.

The floating diffusion region 531 is a region that corresponds to the floating diffusion (FD), and is configured as an n+-type impurity layer. Note that the floating diffusion region 531 corresponds to the diffusion layer 371 of FIG. 3. In other words, a potential change in the floating diffusion region 531 is output via the amplifying transistor 314 as a pixel signal.

The accumulation region 521 is an accumulation region for accumulating charges generated through photoelectric conversion therein. The accumulation region 521 is an accumulation region of the photodiode 311 and is configured as an n-type impurity layer. Note that, on the interface side of the accumulation region 521 (upper side of FIG. 4), a diffusion layer of p+-type impurities (the p-type diffusion layer 522) is formed facing the insulating film 551. The p-type diffusion layer 522 functions as an accumulation region of holes in the photodiode 311. By providing the p-type diffusion layer 522 adjacent to the accumulation region 521 in this manner, an embedded-type photodiode with a p-n-p-type HAD (Hole Accumulated Diode) structure is configured in the pixel 310.

The transfer gate electrode 541 is a p+-type silicon layer provided on the insulating film 551. The transfer gate electrode 541 faces an n-type region (n-type diffusion layer 542) having the insulating film 551 therebetween, thereby forming an embedded-type MOS transistor. The transfer gate electrode 541 corresponds to the gate terminal of the transfer transistor 312 (see FIG. 2), and transfers charges from the accumulation region 521 to the floating diffusion region 531 by being set in a conductive state. Note that the transfer gate electrode 541 corresponds to the gate wiring 362 shown in FIG. 3.

The transfer gate electrode 541 is formed by doping, for example, p-type impurities (for example, boron) with a high concentration equal to or higher than $1 \times 10^{19}$ atoms/cm$^3$. Accordingly, the difference between a potential in the periphery of the insulating film 551 that the transfer gate electrode 541 faces (a substrate surface that the transfer gate electrode 541 faces) and a potential of the p-well 512 decreases. In other words, by putting the p-type impurities with a high concentration into the transfer gate electrode 541, the potential is elevated in the direction in which a depression of the potential on the substrate surface that the transfer gate electrode 541 faces is shallow due to the difference of work functions.

The n-type diffusion layer 542 is an n-type impurity layer provided immediately below the transfer gate electrode 541 (on the lower side of FIG. 4). The n-type diffusion layer 542 is formed such that the ends thereof (the right end and the left end of the n-type diffusion layer 542 shown in FIG. 4) come into contact with the accumulation region 521 and the floating diffusion region 531. The n-type diffusion layer 542 is formed by doping, for example, n-type impurities (for example, arsenic or phosphorus) with a high concentration equal to or higher than $1 \times 10^{15}$ atoms/cm$^3$.

In order to ensure an operation as an embedded channel, the n-type diffusion layer 542 is formed so as to have the peak concentration of the impurities in a depth within 0.2 μm from the insulating film 551 (substrate surface). Accordingly, a channel route when the transfer transistor 312 is in a conductive state (hereinafter referred to as a gate-on state) is located apart from the substrate surface, and accordingly, a completely embedded channel is formed. Note that details of the n-type diffusion layer 542 will be described with reference to FIGS. 5 and 6, and thus description thereof is omitted herein.

Next, in FIGS. 5 and 6, the relationship between the on and off states of the transfer transistor 312 and the channel of the n-type diffusion layer 542 will be described showing transition of the potential on the line A-B and the line C-D shown in FIG. 4.

[Example of a Potential Profile in a Depth Direction]

Figure 5:
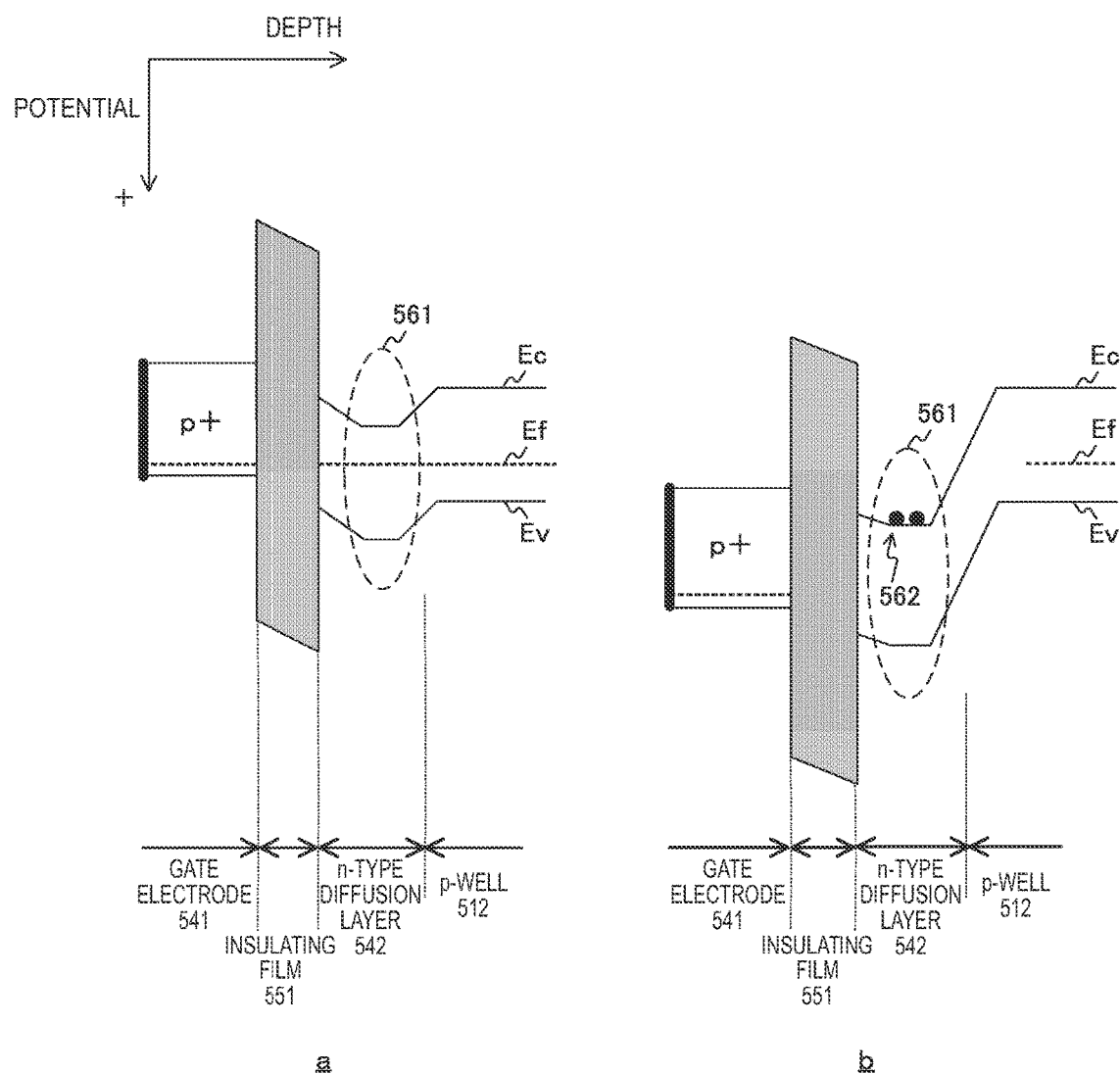
FIG. 5 is a diagram schematically showing a potential profile in the depth direction (the position indicated by the line A-B of FIG. 4) of a transfer gate electrode 541 of the transfer transistor 312 in the first embodiment of the present technology.

FIG. 5 is a diagram schematically showing a potential profile in the depth direction (the position indicated by the line A-B of FIG. 4) of the transfer gate electrode 541 of the transfer transistor 312 in the first embodiment of the present technology.

In a of FIG. 5, a potential profile in a gate-off state is shown, and in b of FIG. 5, a potential profile in a gate-on state is shown. Note that FIG. 5 shows the potential on the line A-B shown in FIG. 4.

Note that description will be provided on the assumption that electrons are carriers by setting the longitudinal direction to be an axis indicating potential and the lateral direction to be an axis indicating the depth in FIG. 5. Note that, in FIG. 5, the lower direction (lower side of FIG. 5) represents positive potentials and the right direction (right side of FIG. 5) represents the depth direction (the direction away from the transfer gate electrode 541 and toward the substrate 511).

In addition, in a and b of FIG. 5, Ec indicates the lower end of a conductive band, Ev indicates the upper end of a valance band, and Ef indicates a quasi-Fermi level. In addition, FIG. 5 shows a region (region 561) indicating the position of the region with a minimum potential (depression of the potential) and black circles indicating electrons (electrons 562).

Here, the potential of the transfer gate electrode 541 in the depth direction will be described.

The part of the of the n-type diffusion layer 542 near the substrate surface (in the periphery thereof facing the insulating film 551) is depleted due to the difference of work functions because the transfer gate electrode 541 is doped to be the p+-type. For this reason, the potential is raised in the shallow direction (on the upper side of FIG. 5) near the substrate surface of the n-type diffusion layer 542. For this reason, the depression of potential (region 561) is formed in a position of the n-type diffusion layer 542 away from the insulating film 551.

As shown in a and b of FIG. 5, the depression of potential (region 561) that is a position in which electrons flow is formed in the region away from the insulating film 551.

[Example of a Potential Profile in a Lateral Direction]

FIG. 6 is a diagram schematically showing a potential profile in the lateral direction (a position on the line C-D of FIG. 4) of the n-type diffusion layer 542 in the first embodiment of the present technology.

a of FIG. 6 indicates a potential profile in a gate-off state, and b of FIG. 6 indicates a potential profile in a gate-on state. Note that FIG. 6 shows the potential on the line C-D shown in FIG. 4. In addition, in FIG. 6, description will be provided by setting the longitudinal direction to be an axis indicating potentials and the lower direction (lower side of FIG. 6) to represent positive potentials.

Note that, in FIG. 6, the depression of the potential (region 561) shown in FIG. 5 is indicated by a region surrounded by the dot-dashed line (region 571). The size of the region 571 in the longitudinal direction (width thereof in the longitudinal direction) will be described as indicating the height of a potential barrier formed in the depression of the potential.

As shown in a of FIG. 6, when the transfer transistor 312 is in the gate-off state, the potential of the depression of the potential (region 571) formed in the n-type diffusion layer 542 is shallower than the bottom of the potential in the accumulation region 521 and the floating diffusion region 531. In addition, the potential of the depression of the potential (region 571) is deeper than the potential of the potential barrier formed by the p-well 512 surrounding the accumulation region 521. In other words, the potential of the depression of the potential (region 571) in the gate-off state is to the positive potential side of the potential of the p-well 512, but is to the negative potential side of those of the accumulation region 521 and the floating diffusion region 531. Accordingly, electrons accumulated in the accumulation region 521 are cut by the height of the barrier formed by the depression of the potential (region 571). Note that, in a of FIG. 6, the electrons accumulated in the accumulation region 521 are indicated by the region in gray (region 572), and the route of the electrons crossing over the depression of the potential (region 571) is indicated by the dashed-lined arrow (arrow 574).

As described above, when surplus electrons which are difficult to accumulate with the height of the barrier of the depression of the potential (region 571) are generated in the photodiode, the surplus electrons cross over the barrier formed by the depression of the potential (region 571) and are discharged to the floating diffusion region 531. In other words, when the transfer transistor 312 is in the gate-off state, the n-type diffusion layer 542 functions as an overflow drain in the lateral direction, thereby preventing the electrons overflowing from the accumulation region 521 from leaking to other pixels. Note that the electrons discharged to the floating diffusion region 531 are discharged to the power source in an electron accumulation period (exposure period) by setting the reset transistor 313 (see FIG. 2) to be on.

In addition, as shown in b of FIG. 6, when the transfer transistor 312 is in the gate-on state, the potential of the depression of the potential (region 571) formed in the n-type diffusion layer 542 is modulated to be deeper than the bottom of the potential of the accumulation region 521. Note that the bottom of the potential of the floating diffusion region 531 is even deeper than the modulated potential of the depression of the potential (region 571). As described above, by setting the potentials to be deeper toward the floating diffusion region 531 from the accumulation region 521, the electrons accumulated in the accumulation region 521 are completely transferred to the floating diffusion region 531.

As described above, the n-type diffusion layer 542 functions not only as a transfer route of electrons but also as an overflow drain of the lateral direction.

[Example of a Transfer Route of Electrons]

FIG. 7 is a diagram schematically showing a transfer route of electrons in the pixel 310 provided in the image sensor 100 of the first embodiment of the present technology and a transfer route of electrons in a pixel provided in another image sensor.

a of FIG. 7 shows a transfer route of electrons in a pixel provided in another image sensor and b of FIG. 7 shows a transfer route of electrons in the pixel 310 provided in the image sensor 100.

Note that the cross-sectional diagram of the pixel 310 shown in b of FIG. 7 is a diagram in which the arrow (arrow 582) indicating the transfer route of electrons is added to FIG. 4, and thus description thereof is omitted here.

In the cross-sectional diagram of the pixel shown in a of FIG. 7, a substrate 591, a p-well 592, an accumulation region 593, a p-type diffusion layer 594, a floating diffusion region 595, a transfer gate electrode 596, an insulating film 597, and an element separation region 598 are shown.

In addition, in the cross-sectional diagram of the pixel shown in a of FIG. 7, the arrow (arrow 581) indicating the transfer route of electrons from the accumulation region 593 to the floating diffusion region 595 and the x marks schematically indicating an interface state occurring in the insulating film 597 are shown.

Herein, differences between the transfer route of the electrons in the pixel provided in the other image sensor and the transfer route of the electrons in the pixel 310 will be described.

As shown in a of FIG. 7, the transfer transistor of the pixel provided in the other image sensor is a silicon layer having an n+-type transfer gate electrode, and a channel is formed on the substrate surface (a position immediately below the insulating film 597). Since the channel is formed on the substrate surface, some transferred electrons are doped in the interface state of the substrate surface. The number of electrons doped in the interface state of the substrate surface is at a level from several to dozens as long as the interface does not have a defect, and thus the number of electrons is not a problem in normal imaging. When weak light is to be detected such as when one photon is detected, however, the number of transferred electrons is small (for example, one in single-photon detection), and thus it is an important problem. Noise caused by the trapping (reduction of electrons) is a noise factor that is relatively difficult to reduce even if conversion efficiency of the amplifying transistor or the like is improved, which causes a serious error in a device (for example, a photon-counting device) that digitally determines the number of accumulated electrons (i.e., the number of incident photons).

On the other hand, since the transfer route of the electrons in the pixel 310 is not affected by the interface state since the channel indicated by the arrow 582 is completed embedded. Note that the capturing cross-sectional area of various carrier traps of silicon is set to be about $1\times10^{-14}$ cm$^{-2}$, and thus by forming a channel $1\times10^{-7}$ cm, which is the square root of the capturing cross-sectional area, or farther from the substrate surface, transfer of electrons that is hardly affected by the interface state can be realized.

Note that, when the transfer transistor is designed to be an embedded channel type transistor as in the pixel 310, it is problematic in that a potential of the channel region is difficult to modulate through gate driving in comparison to a surface type channel. For this reason, in order to completely transfer accumulated charges in the photodiode with the potential of the channel in a sufficiently deep state in the gate-on state and to set the deep state with slight modulation, it is necessary to form the channel in a state in which the potential is already deep to a certain degree even in the gate-off state. Such design, however, leads to a critical decrease in the amount of charges that can be accumulated in the accumulation region (the saturation charge amount Qs). Since a decrease in the saturation charge amount Qs results in deterioration in image quality in a general imaging device, designing the transfer transistor to be an embedded channel type transistor is not practical. For this reason, in order to secure a practical saturation charge amount Qs in a general imaging device, the channel should be designed to at least pass through the substrate surface near the drain of the transfer transistor. Accordingly, a large change in the potential in the channel is secured, a leak path in the gate-off state is cut, and the saturation charge amount Qs is set to be a high value.

In the image sensor (image sensor 100) for detecting weak light, however, it is enough to retain several electrons in the accumulation region 521. For example, in the image sensor (image sensor 100) for detecting one photon, one electron is the practical saturation charge amount Qs. For this reason, by designing the transfer transistor to be an embedded channel type transistor, accumulated charges can be transferred without being affected by the interface state. In addition, since the channel also functions as an overflow drain, leakage of electrons to other pixels can be easily prevented.

As described above, by designing the transfer transistor to be an embedded channel type transistor according to the first embodiment of the present technology, the amount of trapped carriers (electrons) can be reduced, and accuracy in detection of weak light can improve. Particularly, by forming the n-type diffusion layer 542 having n-type impurities (for example, arsenic or phosphorus) doped at a high concentration equal to or higher than $1\times10^{15}$ atoms/cm$^3$, only a slight amount of electrons can be accumulated and a pixel in which the accumulated electrons are transferred without being affected by the interface state can be produced. In other words, by doping the n-type impurities at a high concentration equal to or higher than $1\times10^{15}$ atoms/cm$^3$ to form the n-type diffusion layer 542, a pixel appropriate for detecting weak light can be formed.

2. Second Embodiment

In the first embodiment of the present technology, the example in which the transfer gate electrode is formed of a p+-type silicon layer and the embedded channel is formed using the work function of the transfer gate electrode has been described. The formation of the embedded channel, however, is not limited thereto, and an embedded channel can also be formed merely through adjustment of an impurity profile on a substrate.

Thus, in the second embodiment of the present technology, an example in which an embedded channel is formed through adjustment of an impurity profile on a substrate will be described with reference to FIGS. 8 and 9.

[Example of a Cross-Sectional Configuration of a Pixel]

Figure 8:
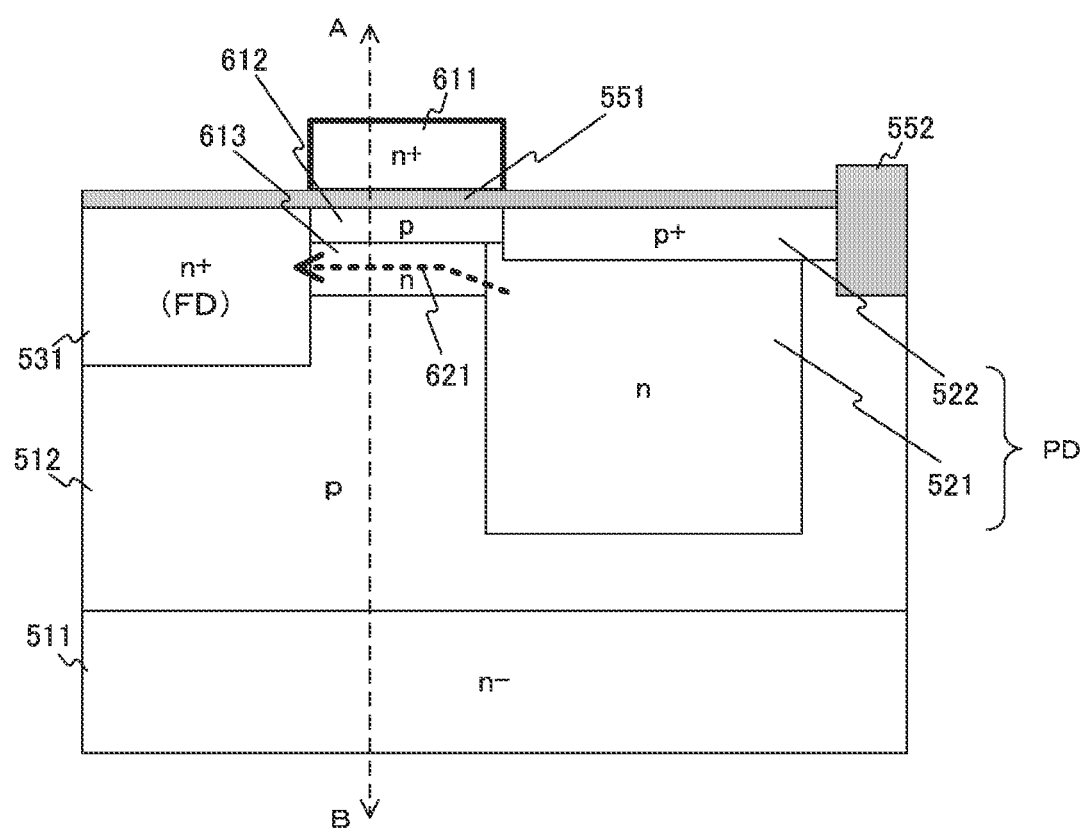
FIG. 8 is a diagram schematically showing a cross-sectional configuration of a transfer transistor of a pixel of a second embodiment of the present technology.

FIG. 8 is a diagram schematically showing a cross-sectional configuration of a transfer transistor of a pixel of a second embodiment of the present technology.

In the cross-sectional configuration shown in FIG. 8, the substrate 511, the p-well 512, the accumulation region 521, the p-type diffusion layer 522, the floating diffusion region 531, the insulation film 551, and the element separation region 552 are shown as in FIG. 4. Furthermore, in the cross-sectional configuration shown in FIG. 8, a transfer gate electrode 611 is shown instead of the transfer gate electrode 541 of FIG. 4. In addition, in FIG. 8, a p-type diffusion layer 612 and an n-type diffusion layer 613 are shown instead of the n-type diffusion layer 542 of FIG. 4.

The transfer gate electrode 611 is an n+-type silicon layer provided on the insulating film 551. Note that since the transfer gate electrode 611 is the same as the transfer gate electrode 596 shown in a of FIG. 7 (the gate electrode of the transfer transistor provided in the other image sensor), description thereof is omitted herein.

The p-type diffusion layer 612 is a p-type impurity layer provided immediately below the transfer gate electrode 611. The p-type diffusion layer 612 is formed so that the ends thereof (the right end and the left end of the p-type diffusion layer 612 shown in FIG. 8) come into contact with the accumulation region 521 and the floating diffusion region 531. In addition, the upper face of the p-type diffusion layer 612 faces the insulating film 551 and the lower face thereof faces the n-type diffusion layer 613. By providing the p-type diffusion layer 612 so as to face the substrate surface, a potential of the substrate surface is raised in the direction in which the depression is shallow.

The n-type diffusion layer 613 is an n-type impurity layer and the same layer as the n-type diffusion layer 542 shown in FIG. 4. The upper face of the n-type diffusion layer 613 faces the p-type diffusion layer 612, the lower face thereof faces the p-well 512, and the right and left sides thereof face the accumulation region 521 and the floating diffusion region 531. Note that, since the n-type diffusion layer 613 is a layer playing the same role as the n-type diffusion layer 542, description thereof will be omitted. In other words, the n-type diffusion layer 613 is formed in a depth within 0.2 μm from the insulating film 551 (the substrate surface) to have the peak concentration of impurities. In addition, the n-type diffusion layer 613 is formed by doping n-type impurities (for example, arsenic or phosphorus) at a high concentration equal to or higher than $1\times10^{15}$ atoms/cm$^3$.

Next, transition of potentials on the line A-B shown in FIG. 8 will be described with reference to FIG. 9.

[Example of a Potential Profile in the Depth Direction]

Figure 9:
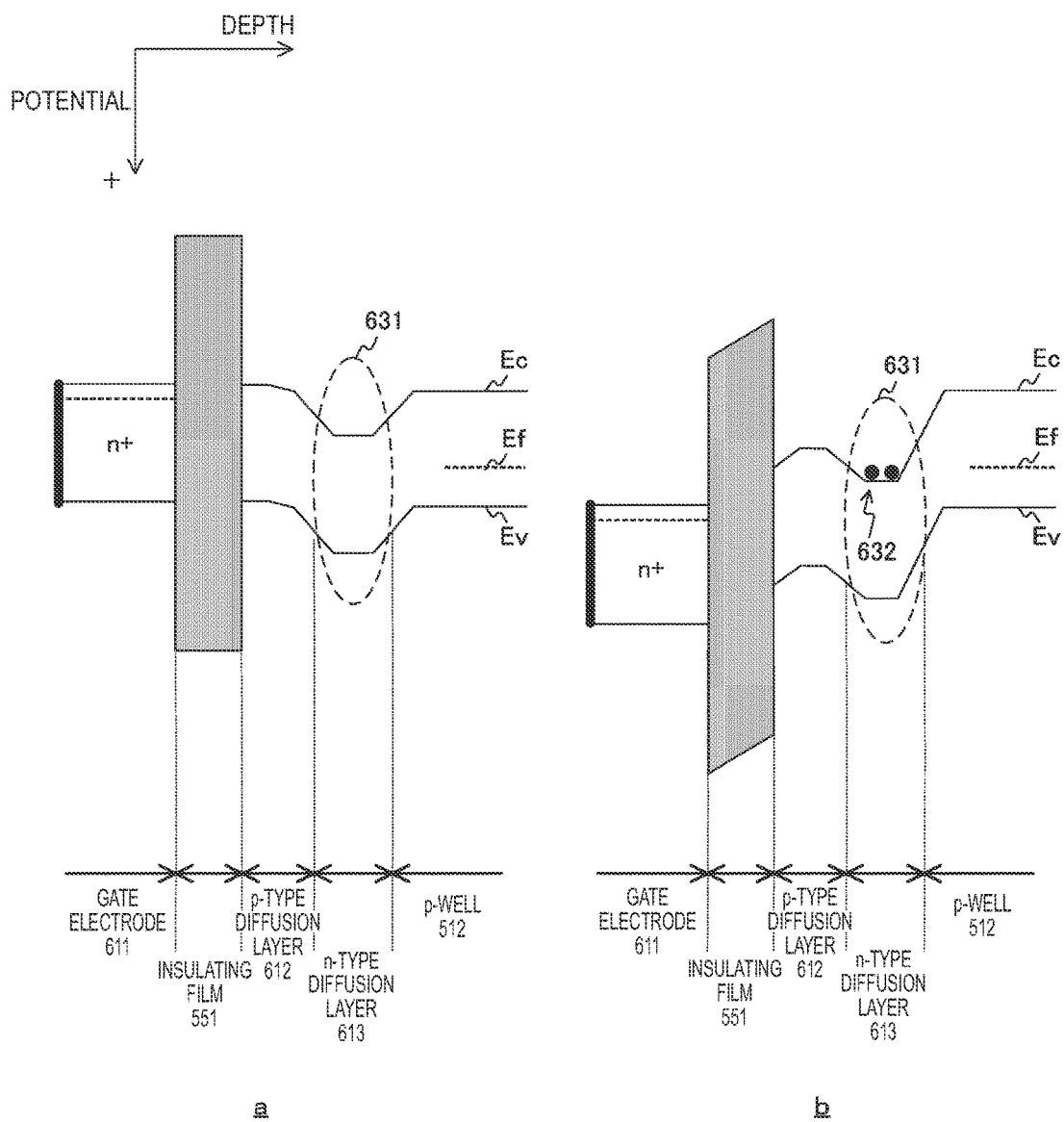
FIG. 9 is a diagram schematically showing a potential profile in the depth direction (the position indicated by the line A-B of FIG. 8) of a transfer gate electrode 611 in the second embodiment of the present technology.

FIG. 9 is a diagram schematically showing a potential profile in the depth direction (the position indicated by the line A-B of FIG. 8) of the transfer gate electrode 611 in the second embodiment of the present technology.

a of FIG. 9 shows a potential profile in a gate-off state and b of FIG. 9 shows a potential profile in a gate-on state. Note that, in FIG. 9, the potential on the line A-B shown in FIG. 8 is shown.

Note that, since FIG. 9 corresponds to the potential profile of FIG. 5, a difference with the potential profile of FIG. 5 will be described herein.

As shown in a of FIG. 9, the potential on the substrate surface immediately below the transfer gate electrode 611 is raised on the shallower side (in the direction of negative potential) in the p-type diffusion layer 612 in the gate-off state. In addition, in the n-type diffusion layer 613, the depression of the potential (region 631) is formed in a position away from the insulating film 551 as in the n-type diffusion layer 542 shown in FIG. 5. Note that the role of the depression of the potential (region 631) is the same as that of the depression of the potential (region 571) shown in FIG. 5. In other words, the potential of the depression of the potential (region 631) is deeper than the potential barrier formed by the p-well 512 surrounding the accumulation region 521, and the depression of the potential also functions as an overflow drain in the lateral direction in the gate-off state.

In addition, in the gate-on state, the potential of the depression of the potential (region 631) is deeper than the bottom of the potential of the accumulation region 521 as shown in b of FIG. 9, and thus electrons accumulated in the accumulation region 521 are completely transferred to the floating diffusion region 531.

As described above, the n-type diffusion layer 613 functions not only as a transfer route of electrons but also as an overflow drain in the lateral direction.

As described above, according to the second embodiment of the present technology, the embedded channel type transfer transistor can be produced merely through adjustment of an impurity profile on the substrate. In other words, according to the second embodiment of the present technology, accuracy in photon-counting can be improved.

3. Third Embodiment

In the first and second embodiments of the present technology, the example in which electrons generated from weak light are transferred to the floating diffusion without being affected by the interface state has been described. Note that, when a multivalued accumulation signal is detected, weak light can be appropriately detected by deciding an imaging condition such as an exposure time based on the number of electrons that can be accumulated in a pixel. There is, however, a possibility of the number of accumulated electrons being different from pixels due to slight unevenness occurring in a manufacturing step of the accumulation region. In other words, when an image sensor to which the first and second embodiments of the present technology are applied is manufactured for a detection device of weak light of which an accumulation signal is multivalued, a possibility of a poor yield of the image sensor is also considered due to the unevenness in the number of electrons that can be accumulated in the accumulation region.

When an image sensor for a detection device for detecting presence or absence of incidence of one photon is manufactured, however, at least one electron may be accumulated in terms of performance of the accumulation region. In other words, when the image sensor to which the first and second embodiments of the present technology are applied is used in a single-photon detection device, unevenness in the manufacturing step of the accumulation region is not a significant problem. As such, the image sensor to which the first and second embodiments of the present technology are applied serves as an image sensor appropriate for single-photon detection, exhibiting the highest effect in single-photon detection.

Thus, in a third embodiment of the present technology, an example of an image sensor provided in an imaging device for detecting presence or absence of incidence of one photon will be described with reference to FIGS. 10 and 11.

Note that, since a configuration of a pixel of the image sensor in the third embodiment of the present technology is the same as in the first and second embodiments of the present technology, description thereof will be omitted herein. Description will be provided herein focusing on a determination circuit that processes a signal output by a pixel for single-photon detection.

[Configuration Example of a Determination Circuit]

Figure 10:
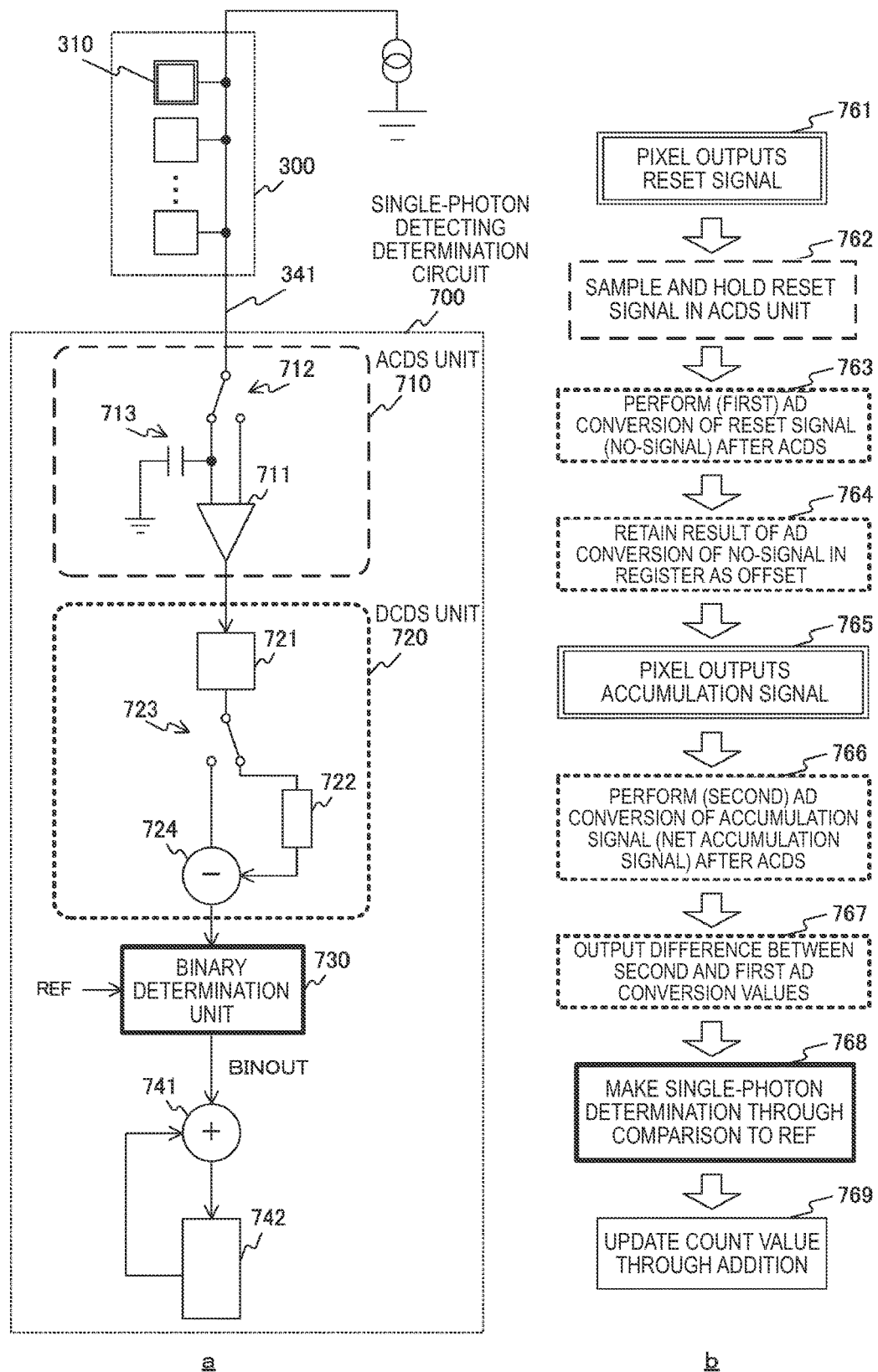
FIG. 10 is a conceptual diagram showing one functional configuration example of a determination circuit for detecting one photon (single-photon detecting determination circuit 700) and one operation example of the single-photon detecting determination circuit 700 of a third embodiment of the present technology.

FIG. 10 is a conceptual diagram showing one functional configuration example of a determination circuit for detecting one photon (single-photon detecting determination circuit 700) and one operation example of the single-photon detecting determination circuit 700 of the third embodiment of the present technology.

The single-photon detecting determination circuit 700 in FIG. 10 is provided in the image sensor instead of the determination circuit 400 of FIG. 1.

In a of FIG. 10, as functional constituent elements of the single-photon detecting determination circuit 700, an ACDS (Analog Correlated Double Sampling) unit 710, a DCDS (Digital CDS; Digital Correlated Double Sampling) unit 720, a binary determination unit 730, an adder 741, a memory 742, and the like are shown.

In addition, in a of FIG. 10, the vertical signal line 341 connected to the single-photon detecting determination circuit 700, a part of the pixel 310 connected to the vertical signal line 341, and the pixel array unit 300 are shown together as the functional constituent elements of the single-photon detecting determination circuit 700.

The ACDS unit 710 removes noise through analog CDS, and is provided with a switch 712, a capacitor 713, and a comparator 711.

The switch 712 is a switch for connecting the vertical signal line 341 to either an input terminal through which a reference voltage is input to the comparator 711 or an input terminal through which a signal to be compared is input to the comparator 711. When a reset signal of the pixel 310 is subject to being sampled and held, the switch 712 connects the vertical signal line 341 to the input terminal through which the reference voltage is input (the left terminal connected to the capacitor 713). In addition, when the comparator 711 outputs a result of analog CDS, the switch 712 connects the vertical signal line 341 to the input terminal through which the signal to be compared is input (the right terminal that does not have a capacitor).

The capacitor 713 is a retention capacitor for sampling and holding the reset signal of the pixel 310.

The comparator 711 outputs a difference between the sampled and held signal and the signal to be compared. In other words, the comparator 711 outputs the difference between the sampled and held reset signal and the signal supplied from the vertical signal line 341 (accumulation signal or reset signal). That is to say, the comparator 711 outputs a signal from which noise such as kTC noise generated in the pixel 310 has been removed. The comparator 711 is realized by, for example, an operational amplifier of gain 1. The comparator 711 supplies the difference signal to the DCDS unit 720. Note that, herein, the difference signal between the reset signal and the reset signal is referred to as no-signal, and the difference signal between the reset signal and the accumulation signal is referred to as a net accumulation signal.

The DCDS unit 702 removes noise through digital CDS, and is provided with an AD (Analog Digital) converter 721, a register 722, a switch 723, and a subtractor 724.

The AD converter 721 AD-converts the signal supplied from the comparator 711.

The switch 723 is a switch for switching a supply destination of the AD-converted signal generated by the AD converter 721. When the AD converter 721 outputs the result of the AD conversion of no-signal (digital no-signal), the switch 723 supplies the signal to the register 722 to cause the register 722 to latch (retain) the signal. Accordingly, the offset value of the comparator 711 and the AD converter 721 is retained in the register 722. In addition, when the AD converter 721 outputs the result of the AD conversion of the net accumulation signal (digital net accumulation signal), the switch 723 supplies the signal to the subtractor 724.

The register 722 retains the result of the AD conversion of no-signal. The register 722 supplies the retained result of the AD conversion of no-signal (digital no-signal) to the subtractor 724.

The subtractor 724 subtracts the value of the digital no-signal from the value of the digital net accumulation signal. The subtractor 724 supplies the subtraction result (net digital value) to the binary determination unit 730.

The binary determination unit 730 makes a binary determination (digital determination). The binary determination unit 730 compares the net digital value to a reference signal (indicated as "REF" in FIG. 10) of the binary determination unit 730 to make a binary determination on the presence or absence of incidence of a photon on the pixel 310, and then outputs the determination result (indicated as "BINOUT" in FIG. 10). Note that, for the reference signal (REF), a value in the vicinity of the intermediate value between the digital value of the signal output by the pixel 310 at the time of absence of photon incidence (no-signal) and the digital value of the signal output by the pixel 310 at the time of presence of photon incidence (accumulation-signal) is set (for example, "50" that is halfway between "0" and "100" is the reference signal). In other words, the reference signal (REF) functions as a threshold value.

For example, when the net digital value supplied from the DCDS unit 720 exceeds the value of the reference signal (REF), a signal with the value of "1" representing "photon incidence present" (BINOUT) is output. On the other hand, when the net digital value supplied from the DCDS unit 720 does not exceed the value of the reference signal (REF), a signal with the value of "0" representing "photon incidence absent" (BINOUT) is output. In other words, the presence or absence of photon incidence is output from the binary determination unit 730 as a digital value (0 or 1) of the binary determination result. The binary determination unit 730 supplies the determination result (BINOUT) to the adder 741.

The adder 741 adds the digital value of the determination result supplied from the binary determination unit 730 to a count value of each pixel retained in the memory 742. The adder 741 acquires the count value of the pixel 310 that has generated the accumulation signal turning into a digital value in the binary determination from the memory 742 and then adds the digital value of the binary determination result to the acquired count value. Then, the adder 741 supplies the added count value to the memory 742 to update the count value of the pixel.

The memory 742 is a memory digitally storing count values indicating light intensity of each pixel. The memory 742 outputs the count value with which a predetermined number of binary determination results is integrated from the output circuit. Note that, in FIG. 10, a signal line to the output circuit is omitted for the convenience of description.

Note that, in FIG. 10, description has been provided on the assumption that the binary determination unit 730 and the adder 741 are provided for each single-photon detecting determination circuit 700, but the present technology is not limited thereto, and a plurality of single-photon detecting determination circuits 700 may share the binary determination unit 730 and the adder 741. In addition to being provided in a semiconductor imaging chip (image sensor 100), the binary determination unit 730 and the adder 741 may be provided in a signal processing chip that receives and processes signals from a semiconductor imaging chip.

Herein, an operation of the single-photon detecting determination circuit 700 performed when presence or absence of incidence of a photon is binarily determined in one pixel 310 will be described with reference to b of FIG. 10.

b of FIG. 10 shows a flowchart showing one operation example of the single-photon detecting determination circuit 700. Note that the frames of the operations of the flowchart shown in b of FIG. 10 substantially correspond to the frames surrounding the constituent elements shown in a of FIG. 10. In other words, the operations in the double line frame represent the operations of the pixel 310, the operation in the long-dashed line frame represents the operation of the ACDS unit 710, the operations in the short-dashed line frame represent the operations of the DCDS unit 720, and the operation in the thick solid line frame represents the operation of the binary determination unit 730. Note that, for convenience of description, the ACDS process performed by the ACDS unit 710 is not illustrated and will be described together in the operation in which the DCDS unit 720 performs the AD conversion.

First, the potential of the gate terminal of the amplifying transistor 314 (potential of the FD 322) is reset and the reset signal is output to the vertical signal line 341 in the pixel (pixel 310) in a selected row (Step 761).

Then, the reset signal output from the pixel 310 is sampled and held by the capacitor 713 of the ACDS unit 710 (Step 762). Then, the difference signal of the sampled and held reset signal and the reset signal output from the pixel 310 (no-signal) is AD-converted by the AD converter 721 of the DCDS unit 720 (Step 763). Note that the AD-converted no-signal includes noise generated from the comparator 711 and the AD converter 721, and a value for cancelling (offsetting) the noise is digitally detected. Then, the result of the AD conversion of the no-signal is retained in the register 722 as an offset value (Step 764).

Then, electrons accumulated in the photodiode 311 are transferred to the FD 322 in the pixel 310, and then an accumulation signal is output from the pixel 310 (Step 765). Then, the difference signal of the sampled and held reset signal and the accumulation signal output from the pixel 310 (net accumulation signal) is AD-converted by the AD converter 721 of the DCDS unit 720 (Step 766). Note that the result of the AD conversion includes the noise generated by the comparator 711 and the AD converter 721.

Then, the subtractor 724 outputs the value obtained by subtracting the value of the result of the (first) AD conversion of the no-signal retained in the register 722 from the value of the result of the (second) AD conversion of the net accumulation signal (Step 767). Accordingly, the noise (offset component) caused by the comparator 711 and the AD converter 721 is cancelled, and the digital value of only the accumulation signal output by the pixel 310 (net digital value) is output.

Then, the net digital value output from the subtractor 724 and the reference signal (REF) are compared by the binary determination unit 730 (Step S768). For the reference signal (REF), a value in the vicinity of the intermediate value between the digital value of the signal output by the pixel 310 at the time of absence of photon incidence (no-signal) and the digital value of the signal output by the pixel 310 at the time of presence of photon incidence (accumulation-signal) is set (for example, "50," which is halfway between "0" and "100," is the reference signal). When the digital value output by the subtractor 724 (digital value only of the accumulation signal output by the pixel 310) exceeds the value of the reference signal (REF), a signal with the value of "1" representing "photon incidence present" (BINOUT) is output. On the other hand, when the digital value output by the subtractor 724 does not exceed the value of the reference signal (REF), a signal with the value of "0" representing "photon incidence absent" (BINOUT) is output. In other words, the presence or absence of photon incidence is output from the image sensor 100 as a digital value (0 or 1) of the binary determination result.

Then, the digital value of the binary determination result is added to the count value of the pixel 310 that has generated the accumulation signal, and the count value of the pixel is thereby updated (Step S769).

Note that FIG. 10 has been described on the assumption of single-photon detection and on the premise that a two-valued determination of "photon incidence present" and "photon incidence absent" (binary determination) is made, but a two- or higher-valued determination can be made by preparing a plurality of systems of reference signals (REF). For example, two systems of reference signals (REF) are prepared, and one system is set to be the intermediate value between the digital value when the number of photons is "0" and the digital value when the number of photons is "1." In addition, the other system is set to be the intermediate value between the digital values when the number of photons is "1" and the digital value when the number of photons is "2." Accordingly, three determinations for the numbers of photons of "0," "1," and "2" are possible and the dynamic range of imaging improves. Note that, since such a multivalued determination is heavily affected by unevenness in conversion efficiency of each pixel or the like, it is necessary to manufacture the determination system with higher accuracy than when a two-valued determination system is manufactured. The point that a signal generated by a pixel is treated as a digital output, however, is the same as in the binary determination in which only presence or absence of incidence of a photon (0 or 1) is determined from a signal generated by a pixel.

As described above, since the signal output by the pixel 310 is determined as a digital value in the single-photon detecting determination circuit 700, the signal is almost entirely unaffected by noise being transferred in comparison to an image sensor of the related art that treats a signal as an analog output (1024 grayscales in the case of 10-bit data). In addition, by sharing the count value retained in the memory with a plurality of pixels (for example, sharing the storage address of the value), the binary determination results of the plurality of sharing pixels can be added to the count value, and the plurality of pixels can be treated as data of one light receiving plane. In this manner, the dynamic range of imaging can improve.

Next, the relationship between the number of photons incident on each pixel and a detection result will be described with reference to FIG. 11.

[Example of the Relationship Between the Number of Photons Incident on Each Pixel and a Detection Result]

FIG. 11 is a graph showing the relationship between the average number of photons incident on each pixel in a unit exposure period and a counting probability in the third embodiment of the present technology.

Note that description will be provided on the assumption that, in terms of each pixel of an image sensor, photons are uniformly and randomly incident on each pixel of the image sensor. Note that photons are also assumed to be uniformly and randomly incident in terms of time.

Under the above condition, the relationship between the average number of photons (average photons) incident on each pixel in a unit exposure period and the probability of incident photons being counted (counting probability) (determination of "1" in the single-photon detecting determination circuit 700) conforms to Poisson distribution. In order to conform to Poisson distribution, the relationship between the average number of photons and the counting probability is as shown in following formula 1.

[Math 1]

$$P(k) = \frac{\lambda^k e^{-\lambda}}{k!}$$ Formula 1

Here, P(k) is the probability that photon incidence occurs k times (k photons are incident) in a unit pixel in a unit exposure period. In addition, λ is the average number of photons (average photons) incident on a unit pixel in a unit exposure period. In addition, e is the base of the natural logarithm (≈2.718).

In other words, the probability P(k) of formula 1 described above indicates the probability that the number of incident photons is the number of photons k when the number of photons incident on each pixel in a unit exposure period is the average number of photons λ.

Herein, the relationship between the average number of photons and the counting probability will be described on the assumption that the average number of photons (average number of photons λ) incident on each pixel of the image sensor in a unit exposure period is "0.21." In this case, the number of photons k and the probability P(k) are in the following relationships based on the above-described formula 1.

Probability that the number of photons incident on a unit pixel is 0 (k=0): 0.8105

Probability that the number of photons incident on a unit pixel is 1 (k=1): 0.1702

Probability that the number of photons incident on a unit pixel is 2 (k=2): 0.0179

Probability that the number of photons incident on a unit pixel is 3 (k=3): 0.0013

(The succeeding probabilities are not shown because their values are extremely low (equal to or lower than 0.00007).)

As above, the value of the probability that photons incident on a unit pixel overlap becomes smaller as the number of overlapping photons increases.

Next, a signal generated by the image sensor when a photon is incident with the probability will be described.

The case in which a digital value output by the single-photon detecting determination circuit 700 is "0" is the case in which the number of photons incident on a unit pixel is 0. In other words, the probability that the digital value is "0" is the probability of the case in which the number of photons incident on a unit pixel is 0, which is "0.8105."

On the other hand, the case in which a digital value output by the single-photon detecting determination circuit 700 is "1" is the cases in which the number of photons incident on a unit pixel is 1 or higher. In other words, the probability that the digital value is "1" (counting probability) is the value obtained by summing the probabilities of the cases in which the number of photons incident on a unit pixel is 1 or higher, which is "0.1894."

Note that, since the average number of photons $\lambda$ is "0.21," the counting probability of "0.1894" indicates that about 10% of incident photons are not counted (counting loss). This counting loss is caused by counting incidence of two or more photons on a unit pixel in a unit exposure period as "1." Thus, as the average number of photons $\lambda$ increases, the counting loss also increases.

So far, description has been provided on the assumption that the average number of photons $\lambda$ is "0.21," however, the relationship between the average number of photons $\lambda$ and the counting probability is unique when photons are uniformly and randomly incident in terms of space and time. In other words, if the vertical axis is set to be an axis indicating counting probabilities and the horizontal axis is set to the average number of photons incident on each pixel in a unit exposure time, the relationship between the counting probability and the average number of photons forms the relationship shown by the solid line (line 791) of the graph of FIG. 11.

Note that, in the graph of FIG. 11, the position of the average number of photons indicated by the chain line (chain line 792) represents the position in which about 10% of incident photons are lost in counting (10% detection loss position). When the counting loss of about 10% is tolerated, linearity is regarded as being able to be assured when the average number of photons is "0.21" or lower. When the case is considered in terms of the digital output values generated by the image sensor, in other words, when the counting probability of the digital values generated by the image sensor is "0.1894" or lower, imaging is determined to have been performed under the conditions of luminance and exposure that can assure linearity. On the other hand, when the counting probability exceeds "0.1894" (in the range indicated by the compressed region 793 of FIG. 11), linearity is determined to be difficult to assure.

Note that, since the relationship shown in the graph of FIG. 11 is formed between the counting probability and the average number of photons, it is possible to correct a count value by retaining data indicating the relationship shown in the graph (for example, Poisson distribution or a function or a table approximating Poisson distribution). The correction is made by first computing a counting probability (the ratio of pixels having the value of "1" to the entire pixels) based on the digital values generated by the image sensor, and then computing the average number of photons from the counting probability and the data representing the relationship shown in the graph of FIG. 11. Then, the number of photons incident on the image sensor is computed from the computed average number of photons. When the correction is made, the dynamic range of detection can be increased by about a single digit in comparison to the case in which it is used within the range in which linearity can be assured (the case with no correction).

As described above, according to the third embodiment of the present technology, single-photon detection can be performed without being affected by the interface state by designing the transfer transistor to be an embedded channel type transistor. In other words, by designing the embedded channel type transistor by forming the n-type diffusion layer in which the concentration of impurities hits its peak in a depth within 0.2 µm from the insulating film (substrate surface) of n-type impurities with a high concentration equal to or higher than $1 \times 10^{15}$ atoms/cm$^3$, the transfer transistor suitable for single-photon detection can be provided in pixels.

As described above, according to the embodiments of the present technology, by designing the transfer transistor to be an embedded channel type transistor, accuracy in photon-counting can improve. In other words, by performing photon-counting using a CMOS image sensor to which the present technology is applied, noise generated during charge transfer in pixels such as trapping of electrons caused by the interface state can be suppressed. In other words, one photon can be detected in pixels having a similar structure to a general CMOS image sensor, and accordingly photon-counting is possible in imaging with ultra-low noise and ultra-high sensitivity.

Note that the image sensor shown in the embodiments of the present technology can be broadly applied as a light detector of an electronic device of the related art in which a photomultiplier tube, an avalanche photodiode, a photodiode, or the like is provided. For example, the image sensor can be applied to, for example, a fluorescent scanner of an imaging plate, and a scintillation counter of radiation. In addition to them, the image sensor can also be applied to a DNA chip detector, an X-ray imaging device called DR (Digital Radiography), a CT (Computed Tomography) device, a SPECT (Single Photon Emission Tomography) device, and the like. Particularly, since the CMOS image sensor is inexpensive and thus can be mass-produced, by providing many light detectors in an electronic device that was previously provided with only a small number of light detectors due to high-priced photomultiplier tubes, a detection speed can be enhanced.

For example, if the image sensor shown in the embodiments of the present technology is employed in a detector of a CT device, scintillation light having much higher sensitivity than a detector using a photodiode or the like of the related art can be detected, which can contribute to improved accuracy in detection and low exposure to X-rays attributable to a reduction in the amount of X-rays. Note that the same effect will be exhibited in detection of gamma rays using a photomultiplier tube in the related art in SPECT, PET, or the like.

Note that the same effect can be obtained not only in an electronic device provided with many detection heads but also in an electronic device using a single detection head. For example, if the present technology is applied to a scintillation dosimeter of radiation, a small-sized and light pocket dosimeter having ultra-high sensitivity can be realized using an inexpensive semiconductor image sensor.

Note that the above-described embodiments show examples embodying the present technology, and the subjects in the embodiments and a subject matter in the claims have respective correspondence relationships. Likewise, the subject matter in the claims and the subjects in the embodiments of the present technology to which the same names as those in the claims are given have respective correspondence relationships. The present technology is, however, not limited to the embodiments, and can be embodied by making various modifications in the embodiments in the range not departing from the gist of the technology.

In addition, the processing procedures described in the embodiments above may be understood as a method having the series of procedures, or may be understood as a program for causing a computer to execute the series of procedures or a recording medium storing the program. As the recording medium, for example, a hard disk, a CD (Compact Disc), an MD (MiniDisc), a DVD (Digital Versatile Disk), a memory card, a Blu-ray disc (registered trademark), or the like can be used.

Additionally, the present technology may also be configured as below.

(1)

An image sensor including:
pixels each configured to include a transfer transistor configured as an embedded channel type MOS transistor and to output a pixel signal based on a charge transferred to a floating diffusion from a photodiode by the transfer transistor in an on state; and
a determination unit configured to convert the output pixel signal to a digital value, then compare the converted digital value to a threshold value, and thereby make a binary determination on presence or absence of incidence of a photon on the pixel that has generated the pixel signal.

(2)

The image sensor according to (2),
wherein the photodiode includes a charge accumulation region constituted by a first conductive impurity diffusion layer,
wherein the floating diffusion is constituted by the first conductive impurity diffusion layer, and
wherein the transfer transistor includes a channel region serving as a channel between the photodiode and the floating diffusion, and the channel region is constituted by the first conductive impurity diffusion layer having a concentration equal to or higher than $1\times10^{15}$ atoms/cm$^3$.

(3)

The image sensor according to (2), wherein the channel region has the peak of impurities formed in a depth within 0.2 μm from a substrate surface on a side on which a gate electrode of the transfer transistor is formed.

(4)

The image sensor according to (2), wherein, when the transfer transistor is in an off state, the channel region functions as an overflow drain for discharging surplus charges from the charge accumulation region to the impurity diffusion layer.

(5)

The image sensor according to (2), wherein, as the transfer transistor modulates a potential on a substrate surface that a gate electrode of the transfer transistor faces in a direction in which the potential becomes shallow using a difference of work functions of the gate electrode and the substrate that the gate electrode faces, the channel is formed in a position away from the substrate surface that the gate electrode faces toward the inside of the substrate.

(6)

The image sensor according to (2), wherein the transfer transistor has the peak of impurities formed in a depth within 0.2 μm from a substrate surface on the side on which a gate electrode of the transfer transistor is formed, and a second conductive impurity diffusion layer is formed between the peak of the impurities and the gate electrode.

(7)

An image sensor including:
pixels each configured to include a transfer transistor configured as an embedded channel type MOS transistor and to output a pixel signal based on a charge transferred to a floating diffusion from a photodiode by the transfer transistor in an on state; and
a determination unit configured to convert the output pixel signal to a digital value, then compare the converted digital value to a plurality of threshold values, and thereby make a determination on the number of photons incident on the pixel that has generated the pixel signal.

(8)

An electronic device including:
pixels each configured to include a transfer transistor configured as an embedded channel type MOS transistor and to output a pixel signal based on a charge transferred to a floating diffusion from a photodiode by the transfer transistor in an on state; and
a determination unit configured to convert the output pixel signal to a digital value, then compare the converted digital value to a threshold value, and thereby make a binary determination on presence or absence of incidence of a photon on the pixel that has generated the pixel signal.

REFERENCE SIGNS LIST 100 image sensor
112 first vertical drive circuit
114 register
115 second vertical drive circuit
118 output circuit
300 pixel array unit
310 pixel
311 photodiode
312 transfer transistor
313 reset transistor
314 amplifying transistor
511 substrate
512 p-well
521 accumulation region
522 p-type diffusion layer
531 floating diffusion region
541 transfer gate electrode
542 n-type diffusion layer
551 insulating film
552 element separation region

The invention claimed is:

1. An image sensor comprising:
a plurality of pixels, wherein a respective one of the plurality of pixels includes a transfer transistor configured as an embedded channel type MOS transistor and is configured to output a pixel signal based on a charge transferred to a floating diffusion from a photodiode by the transfer transistor in an on state; and
a determination unit configured to convert the respective output pixel signal to a digital value, then compare the converted digital value to a threshold value, and thereby make a binary determination on presence or absence of incidence of a photon on the corresponding pixel that has generated the pixel signal.

2. The image sensor according to claim 1,
wherein the photodiode includes a charge accumulation region constituted by a first conductive impurity diffusion layer,
wherein the floating diffusion is constituted by the first conductive impurity diffusion layer, and
wherein the transfer transistor includes a channel region serving as a channel between the photodiode and the floating diffusion, and the channel region is constituted by the first conductive impurity diffusion layer having a concentration equal to or higher than $1\times10^{15}$ atoms/cm$^3$.

3. The image sensor according to claim 2, wherein the channel region has a peak of impurities formed in a depth within 0.2 μm from a substrate surface on a side on which a gate electrode of the transfer transistor is formed.

4. The image sensor according to claim 2, wherein, when the transfer transistor is in an off state, the channel region functions as an overflow drain for discharging surplus charges from the charge accumulation region to the impurity diffusion layer.

5. The image sensor according to claim 2, wherein, as the transfer transistor modulates a potential on a substrate surface that a gate electrode of the transfer transistor faces in a direction in which the potential becomes shallow using a difference of work functions of the gate electrode and the substrate that the gate electrode faces, the channel is formed in a position away from the substrate surface that the gate electrode faces toward the inside of the substrate.

6. The image sensor according to claim 2, wherein the transfer transistor has a peak of impurities formed in a depth within 0.2 μm from a substrate surface on the side on which a gate electrode of the transfer transistor is formed, and a second conductive impurity diffusion layer is formed between the peak of the impurities and the gate electrode.

7. An image sensor comprising:
a plurality of pixels, wherein a respective one of the plurality of pixels includes a transfer transistor configured as an embedded channel type MOS transistor and is configured to output a pixel signal based on a charge transferred to a floating diffusion from a photodiode by the transfer transistor in an on state; and
a determination unit configured to convert the respective output pixel signal to a digital value, then compare the converted digital value to a plurality of threshold values, and thereby make a determination on the number of photons incident on the corresponding pixel that has generated the pixel signal.

8. An electronic device comprising:
a plurality of pixels, wherein a respective one of the plurality of pixels includes a transfer transistor configured as an embedded channel type MOS transistor and is configured to output a pixel signal based on a charge transferred to a floating diffusion from a photodiode by the transfer transistor in an on state; and
a determination unit configured to convert the respective output pixel signal to a digital value, then compare the converted digital value to a threshold value, and thereby make a binary determination on presence or absence of incidence of a photon on the corresponding pixel that has generated the pixel signal.

9. The image sensor according to claim 1, wherein the threshold value is an intermediate value between a first digital value corresponding to a state of presence of a photon incidence on the corresponding pixel and a second digital value corresponding to a state of absence of a photon on the corresponding pixel.

10. The image sensor according to claim 1, wherein the threshold value is a predetermined value.

11. The image sensor according to claim 7,
wherein the photodiode includes a charge accumulation region constituted by a first conductive impurity diffusion layer,
wherein the floating diffusion is constituted by the first conductive impurity diffusion layer, and
wherein the transfer transistor includes a channel region serving as a channel between the photodiode and the floating diffusion, and the channel region is constituted by the first conductive impurity diffusion layer having a concentration equal to or higher than $1\times10^{15}$ atoms/cm$^3$.

12. The image sensor according to claim 11, wherein the channel region has a peak of impurities formed in a depth within 0.2 μm from a substrate surface on a side on which a gate electrode of the transfer transistor is formed.

13. The image sensor according to claim 11, wherein, when the transfer transistor is in an off state, the channel region functions as an overflow drain for discharging surplus charges from the charge accumulation region to the impurity diffusion layer.

14. The image sensor according to claim 11, wherein, as the transfer transistor modulates a potential on a substrate surface that a gate electrode of the transfer transistor faces in a direction in which the potential becomes shallow using a difference of work functions of the gate electrode and the substrate that the gate electrode faces, the channel is formed in a position away from the substrate surface that the gate electrode faces toward the inside of the substrate.

15. The image sensor according to claim 11 wherein the transfer transistor has a peak of impurities formed in a depth within 0.2 μm from a substrate surface on the side on which a gate electrode of the transfer transistor is formed, and a second conductive impurity diffusion layer is formed between the peak of the impurities and the gate electrode.

16. The image sensor according to claim 7, wherein a respective one of the plurality of threshold values is an intermediate value between a first digital value corresponding to a state of incidence of n photons on the corresponding pixel and a second digital value corresponding to a state of incidence of n+1 photons on the corresponding pixel, where n is a whole number.

17. The image sensor according to claim 7, wherein the plurality of threshold values is a plurality of predetermined values.

18. The electronic device according to claim 8,
wherein the photodiode includes a charge accumulation region constituted by a first conductive impurity diffusion layer,
wherein the floating diffusion is constituted by the first conductive impurity diffusion layer, and
wherein the transfer transistor includes a channel region serving as a channel between the photodiode and the floating diffusion, and the channel region is constituted by the first conductive impurity diffusion layer having a concentration equal to or higher than $1\times10^{15}$ atoms/cm$^3$.

19. The electronic device according to claim 18, wherein the channel region has a peak of impurities formed in a depth within 0.2 μm from a substrate surface on a side on which a gate electrode of the transfer transistor is formed.

20. The electronic device according to claim 18, wherein, when the transfer transistor is in an off state, the channel region functions as an overflow drain for discharging surplus charges from the charge accumulation region to the impurity diffusion layer.

\* \* \* \* \*